United States Patent
Horsky et al.

(10) Patent No.: US 8,368,309 B2
(45) Date of Patent: *Feb. 5, 2013

(54) METHOD AND APPARATUS FOR EXTRACTING IONS FROM AN ION SOURCE FOR USE IN ION IMPLANTATION

(75) Inventors: Thomas N. Horsky, Boxborough, MA (US); Robert W. Milgate, III, Gloucester, MA (US); George P. Sacco, Jr., Topsfield, MA (US); Dale Conrad Jacobson, Salem, NH (US); Wade Allen Krull, Marblehead, MA (US)

(73) Assignee: SemEquip, Inc., North Billerica, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/648,269

(22) Filed: Dec. 29, 2006

(65) Prior Publication Data

US 2010/0107980 A1 May 6, 2010

Related U.S. Application Data

(63) Continuation of application No. 11/452,003, filed on Jun. 12, 2006, now Pat. No. 7,791,047, which is a continuation-in-part of application No. PCT/US2004/041525, filed on Dec. 9, 2004.

(60) Provisional application No. 60/529,343, filed on Dec. 12, 2003.

(51) Int. Cl.
*H01J 7/24* (2006.01)
*H01J 27/00* (2006.01)

(52) U.S. Cl. ............... 315/111.81; 250/423 R

(58) Field of Classification Search ............ 315/111.81, 315/111.21, 111.41, 111.71, 111.91; 250/492.21, 250/492.22, 492.23, 492.3, 423 R, 424, 429; 118/723 R See application file for complete search history.

(56) References Cited

U.S. PATENT DOCUMENTS

| | | | |
|---|---|---|---|
| 3,955,118 A * | 5/1976 | Flemming | 315/111.81 |
| 4,017,403 A | 4/1977 | Freeman | |
| 4,220,891 A | 9/1980 | Ando et al. | |
| 4,251,746 A | 2/1981 | Kawamura et al. | |
| 4,258,266 A | 3/1981 | Robinson et al. | |
| 4,310,777 A | 1/1982 | Fukushima et al. | |
| 4,338,542 A | 7/1982 | Takanashi et al. | |
| 4,412,900 A | 11/1983 | Tanaka et al. | |
| 4,450,031 A * | 5/1984 | Ono et al. | 156/345.39 |
| 4,563,609 A | 1/1986 | Clerc et al. | |
| 4,636,681 A | 1/1987 | Misumi | |
| 4,697,069 A * | 9/1987 | Bleckmann | 219/517 |
| 4,810,925 A | 3/1989 | Fox | |
| 4,847,504 A | 7/1989 | Aitken | |
| 4,857,809 A | 8/1989 | Torii et al. | |

(Continued)

FOREIGN PATENT DOCUMENTS

WO PCT/US2003/20197 6/2003
WO WO 2005/059942 6/2005

OTHER PUBLICATIONS

U.S. Appl. No. 11/452,003, filed Jun. 12, 2006, Horsky.

(Continued)

*Primary Examiner* — Minh D A
(74) *Attorney, Agent, or Firm* — John S. Paniaguas; Katten Muchin Rosenman LLP

(57) ABSTRACT

Thermal control is provided for an extraction electrode of an ion-beam producing system that prevents formation of deposits and unstable operation and enables use with ions produced from condensable vapors and with ion sources capable of cold and hot operation. Electrical heating of the extraction electrode is employed for extracting decaborane or octadecaborane ions. Active cooling during use with a hot ion source prevents electrode destruction, permitting the extraction electrode to be of heat-conductive and fluorine-resistant aluminum composition.

23 Claims, 29 Drawing Sheets

U.S. PATENT DOCUMENTS

| | | | |
|---|---|---|---|
| 5,019,005 | A | 5/1991 | Choi |
| 5,038,071 | A | 8/1991 | Koizumi et al. |
| 5,055,743 | A | 10/1991 | Ekstrand |
| 5,057,736 | A | 10/1991 | Noda et al. |
| 5,134,301 | A | 7/1992 | Kamata et al. |
| 5,466,941 | A * | 11/1995 | Kim .................... 250/423 R |
| 5,489,550 | A | 2/1996 | Moslehi |
| 5,497,006 | A | 3/1996 | Sferlazzo et al. |
| 5,517,084 | A * | 5/1996 | Leung .................... 315/111.81 |
| 5,668,434 | A | 9/1997 | Kim et al. |
| 5,701,052 | A | 12/1997 | Kim et al. |
| 5,703,372 | A | 12/1997 | Horsky et al. |
| 5,703,429 | A | 12/1997 | Kim et al. |
| 5,744,911 | A | 4/1998 | Kim et al. |
| 5,777,438 | A | 7/1998 | Suzuki |
| 5,831,379 | A | 11/1998 | Jeong et al. |
| 5,852,342 | A | 12/1998 | Kim et al. |
| 5,993,766 | A | 11/1999 | Tom et al. |
| 6,013,332 | A | 1/2000 | Goto et al. |
| 6,033,973 | A * | 3/2000 | Takemura .................... 438/514 |
| 6,043,671 | A | 3/2000 | Mizuta |
| 6,107,634 | A | 8/2000 | Horsky |
| 6,127,201 | A * | 10/2000 | Chino et al. .................... 438/46 |
| 6,259,210 | B1 | 7/2001 | Wells |
| 6,288,403 | B1 | 9/2001 | Horsky et al. |
| 6,358,766 | B1 | 3/2002 | Kasahara |
| 6,391,148 | B2 * | 5/2002 | Marks et al. ............. 156/345.52 |
| 6,403,452 | B1 | 6/2002 | Murakoshi et al. |
| 6,452,338 | B1 | 9/2002 | Horsky |
| 6,459,082 | B1 | 10/2002 | Sakaguchi |
| 6,479,828 | B2 * | 11/2002 | Perel .................... 250/425 |
| 6,570,172 | B2 * | 5/2003 | Kim et al. ................... 250/493.1 |
| 6,670,623 | B2 * | 12/2003 | Vella .................... 250/492.21 |
| 6,686,595 | B2 | 2/2004 | Horsky |
| 6,693,023 | B2 | 2/2004 | Murakoshi et al. |
| 6,777,686 | B2 | 8/2004 | Olson et al. |
| 6,847,043 | B2 | 1/2005 | Murrell et al. |
| 6,850,008 | B2 | 2/2005 | Clark |
| 7,022,994 | B2 | 4/2006 | Fuchs et al. |
| 7,022,999 | B2 | 4/2006 | Horsky et al. |
| 7,084,407 | B2 * | 8/2006 | Ji et al. .................... 250/423 F |
| 7,107,929 | B2 | 9/2006 | Horsky et al. |
| 7,112,804 | B2 | 9/2006 | Horsky et al. |
| 7,185,602 | B2 | 3/2007 | Horsky et al. |
| 7,276,847 | B2 * | 10/2007 | Olson et al. .................... 313/446 |
| 7,791,047 | B2 | 9/2010 | Horsky et al. |
| 2001/0001531 | A1 | 5/2001 | Iwamura et al. |
| 2001/0015613 | A1 | 8/2001 | Koizumi et al. |
| 2001/0042836 | A1 | 11/2001 | Olson et al. |
| 2002/0130271 | A1 | 9/2002 | Murakoshi et al. |
| 2002/0153819 | A1 | 10/2002 | Seo et al. |
| 2003/0030010 | A1 | 2/2003 | Perel et al. |
| 2003/0111014 | A1 | 6/2003 | Donatucci et al. |
| 2003/0127049 | A1 * | 7/2003 | Han et al. .................... 118/715 |
| 2003/0197129 | A1 | 10/2003 | Murrell et al. |
| 2003/0230986 | A1 | 12/2003 | Horsky et al. |
| 2004/0000647 | A1 | 1/2004 | Horsky |
| 2004/0051435 | A1 | 3/2004 | Kawai |
| 2004/0188631 | A1 | 9/2004 | Horsky et al. |
| 2004/0245476 | A1 | 12/2004 | Horsky et al. |
| 2005/0051096 | A1 | 3/2005 | Horsky et al. |
| 2005/0242293 | A1 * | 11/2005 | Benveniste ................ 250/396 R |
| 2005/0269520 | A1 | 12/2005 | Horsky et al. |
| 2006/0097185 | A1 | 5/2006 | Mack |
| 2006/0097193 | A1 | 5/2006 | Horsky et al. |
| 2006/0097645 | A1 | 5/2006 | Horsky |
| 2006/0272775 | A1 * | 12/2006 | Horsky et al. ............ 156/345.37 |
| 2006/0272776 | A1 | 12/2006 | Horsky et al. |
| 2007/0007243 | A1 | 1/2007 | Horita et al. |
| 2007/0107841 | A1 | 5/2007 | Horsky et al. |
| 2007/0108394 | A1 | 5/2007 | Horsky |
| 2007/0108395 | A1 * | 5/2007 | Horsky et al. .................. 250/489 |
| 2007/0210260 | A1 | 9/2007 | Horsky et al. |
| 2007/0241689 | A1 | 10/2007 | Horsky et al. |
| 2007/0262262 | A1 | 11/2007 | Horsky et al. |
| 2007/0278417 | A1 | 12/2007 | Horsky et al. |
| 2008/0121811 | A1 | 5/2008 | Horsky et al. |
| 2008/0223409 | A1 | 9/2008 | Horsky et al. |

OTHER PUBLICATIONS

ISR PCT/US2004/41525
U.S. Appl. No. 11/502,695, filed Aug. 2006, Horsky et al.
Shen et al., J. Chem. Phys. 101 (3), pp. 2261-2266, Aug. 1, 1994.
Greenwood et al., Chemistry of the Elements, 2nd Ed, 2001, Ch. 12, p. 479, Butterworth-Heimann Heimann Publishers, Oxford, England.
Greenwood et al., Chemistry of the Elements, $2^{nd}$ Ed., 2001, Ch. 13, p. 551, Butterworth-Heiemann Publishers, Oxford, England.
Honig et al., RCA Review, 30, p. 285, Jun. 1969.

* cited by examiner

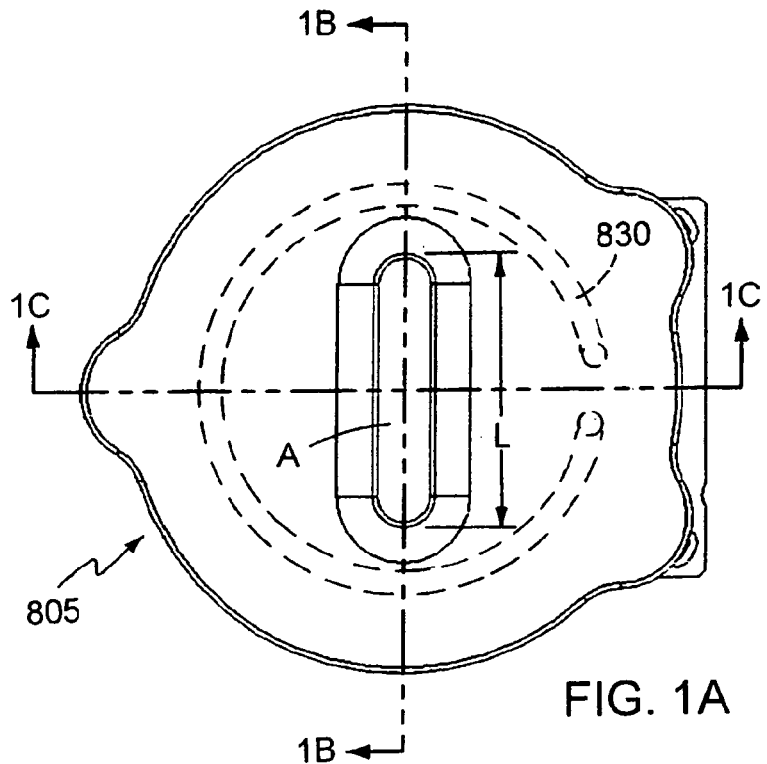
FIG. 1A
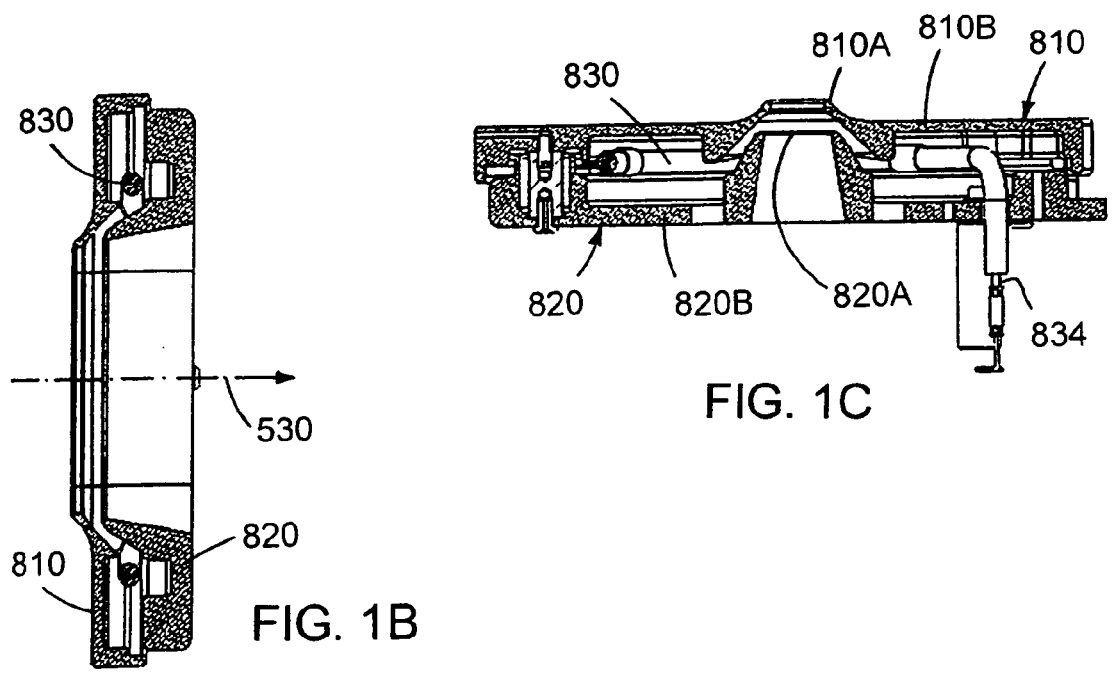
FIG. 1B
FIG. 1C

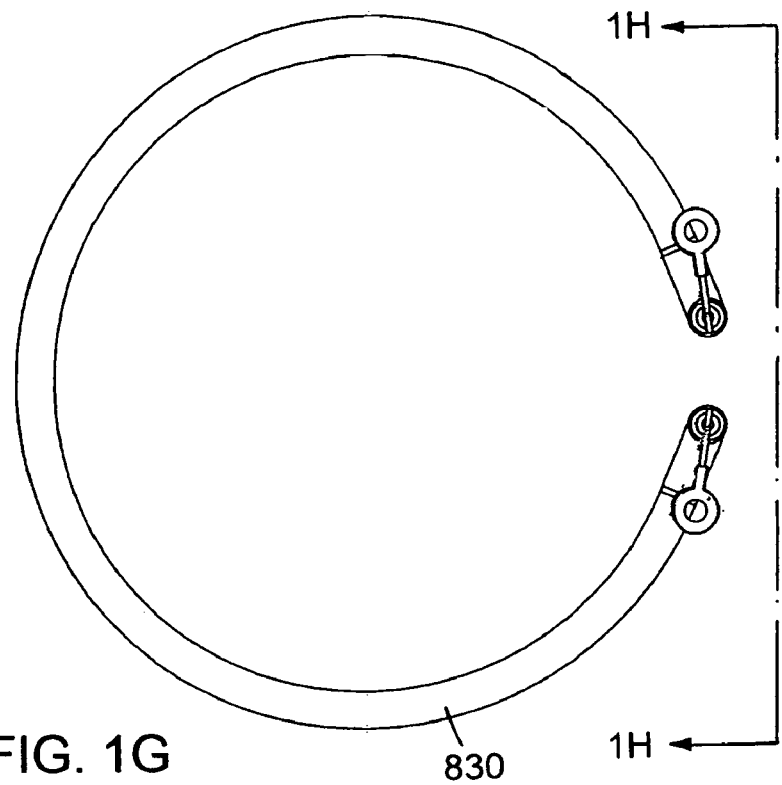
FIG. 1G
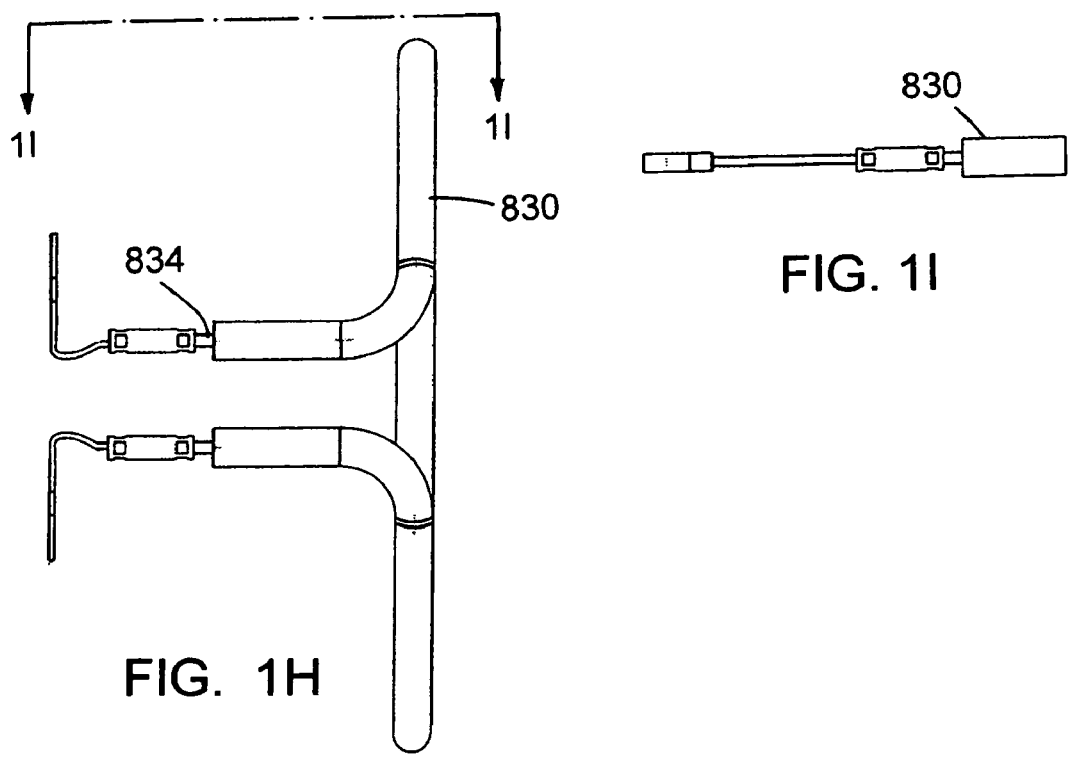
FIG. 1H
FIG. 1I

METHOD AND APPARATUS FOR EXTRACTING IONS FROM AN ION SOURCE FOR USE IN ION IMPLANTATION

CROSS REFERENCE TO RELATED APPLICATIONS

This application is a continuation of U.S. patent application Ser. No. 11/452,003, filed Jun. 12, 2006, now U.S. Pat. No. 7,791,047, which is a continuation-in-part of International Patent Application No. PCT/US2004/041525, filed on Dec. 9, 2004, which, in turn, claims priority to and claims the benefit of U.S. Patent Application No. 60/529,343, filed Dec. 12, 2003.

FIELD OF THE INVENTION

The present invention relates to producing ion beams in which one or more gaseous or vaporized feed materials is ionized in an ion source from which the ions are extracted by an extraction electrode. It also relates to a method and apparatus for operating an ion source and extraction electrode to produce an ion beam for ion implantation of semiconductor substrates and substrates for flat panel displays. In particular the invention concerns extension of the productive time (i.e. the "uptime") of systems that produce ion beams and to maintaining stable ion-extraction conditions during the productive time.

BACKGROUND

Ion beams are produced from ions extracted from an ion source. An ion source typically employs an ionization chamber connected to a high voltage power supply. The ionization chamber is associated with a source of ionizing energy, such as an arc discharge, energetic electrons from an electron-emitting cathode, or a radio frequency or microwave antenna, for example. A source of desired ion species is introduced into the ionization chamber as a feed material in gaseous or vaporized form where it is exposed to the ionizing energy. Extraction of resultant ions from the chamber through an extraction aperture is based on the electric charge of the ions. An extraction electrode is situated outside of the ionization chamber, aligned with the extraction aperture, and at a voltage below that of the ionization chamber. The electrode draws the ions out, typically forming an ion beam. Depending upon desired use, the beam of ions may be mass analyzed for establishing mass and energy purity, accelerated, focused and subjected to scanning forces. The beam is then transported to its point of use, for example into a processing chamber. As the result of the precise energy qualities of the ion beam, its ions may be implanted with high accuracy at desired depth into semiconductor substrates.

The precise qualities of the ion beam can be severely affected by condensation and deposit of the feed material or of its decomposition products on surfaces of the ion beam-producing system, and in particular surfaces that affect ionization, ion extraction and acceleration.

The Ion Implantation Process

The conventional method of introducing a dopant element into a semiconductor wafer is by introduction of a controlled energy ion beam for ion implantation. This introduces desired impurity species into the material of the semiconductor substrate to form doped (or "impurity") regions at desired depth. The impurity elements are selected to bond with the semiconductor material to create electrical carriers, thus altering the electrical conductivity of the semiconductor material. The electrical carriers can either be electrons (generated by N-type dopants) or "holes" (i.e., the absence of an electron), generated by P-type dopants. The concentration of dopant impurities so introduced determines the electrical conductivity of the doped region. Many such N- and P-type impurity regions must be created to form transistor structures, isolation structures and other such electronic structures, which collectively function as a semiconductor device.

To produce an ion beam for ion implantation, a gas or vapor feed material is selected to contain the desired dopant element. The gas or vapor is introduced into the evacuated high voltage ionization chamber while energy is introduced to ionize it. This creates ions which contain the dopant element (for example, in silicon the elements As, P, and Sb are donors or N-type dopants, while B and In are acceptors or P-type dopants). An accelerating electric field is provided by the extraction electrode to extract and accelerate the typically positively charged ions out of the ionization chamber, creating the desired ion beam. When high purity is required, the beam is transported through mass analysis to select the species to be implanted, as is known in the art. The ion beam is ultimately transported to a processing chamber for implantation into the semiconductor wafer.

Similar technology is used in the fabrication of flat-panel displays (FPD's) which incorporate on-substrate driver circuitry to operate the thin-film transistors which populate the displays. The substrate in this case is a transparent panel such as glass to which a semiconductor layer has been applied. Ion sources used in the manufacturing of FPD's are typically physically large, to create large-area ion beams of boron, phosphorus and arsenic-containing materials, for example, which are directed into a chamber containing the substrate to be implanted. Most FPD implanters do not mass-analyze the ion beam prior to its reaching the substrate.

Ion Contamination

In general, ion beams of N-type dopants such as P or As should not contain any significant portion of P-type dopant ions, and ion beams of P-type dopants such as B or In should not contain any significant portion of N-type dopant ions. Such a condition is called "cross-contamination" and is undesirable. Cross-contamination can occur when source feed materials accumulate in the ion source, and the source feed material is then changed, for example, when first running elemental phosphorus feed material to generate an N-type $P^+$ beam, and then switching to $BF_3$ gas to generate a P-type $BF_2^+$ beam.

A serious contamination effect occurs when feed materials accumulate within the ion source so that they interfere with the successful operation of the source. Such a condition invariably has called for removal of the ion source and the extraction electrode for cleaning or replacement, resulting in an extended "down" time of the entire ion implantation system, and consequent loss of productivity.

Many ion sources used in ion implanters for device wafer manufacturing are "hot" sources, that is, they operate by sustaining an arc discharge and generating a dense) plasma; the ionization chamber of such a "hot" source can reach an operating temperature of 800 C or higher, in many cases substantially reducing the accumulation of solid deposits. In addition, the use of $BF_3$ in such sources to generate boron-containing ion beams further reduces deposits, since in the generation of a $BF_3$ plasma, copious amounts of fluorine ions are generated; fluorine can etch the walls of the ion source, and in particular, recover deposited boron through the chemical production of gaseous $BF_3$. With other feed materials, however, detrimental deposits have formed in hot ion sources.

Examples include antimony (Sb) metal, and solid indium (In), the ions of which are used for doping silicon substrates.

Cold ion sources, for example the RF bucket-type ion source which uses an immersed RF antenna to excite the source plasma (see, for example, Leung et al., U.S. Pat. No. 6,094,012, herein incorporated by reference), are used in applications where either the design of the ion source includes permanent magnets which must be kept below their Curie temperature, or the ion source is designed to use thermally-sensitive feed materials which break down if exposed to hot surfaces, or where both of these conditions exist. Cold ion sources suffer more from the deposition of feed materials than do hot sources. The use of halogenated feed materials for producing dopants may help reduce deposits to some extent, however, in certain cases, non-halogen feed materials such as hydrides are preferred over halogenated compounds. For non-halogen applications, ion source feed materials such as gaseous $B_2H_6$, $AsH_3$, and $PH_3$ are used. In some cases, elemental As and P are used, in vaporized form. The use of these gases and vapors in cold ion sources has resulted in significant materials deposition and has required the ion source to be removed and cleaned, sometimes frequently. Cold ion sources which use $B_2H_6$ and $PH_3$ are in common use today in FPD implantation tools. These ion sources suffer from cross-contamination (between N- and P-type dopants) and also from particle formation due to the presence of deposits. When transported to the substrate, particles negatively impact yield. Cross-contamination effects have historically forced FPD manufacturers to use dedicated ion implanters, one for N-type ions, and one for P-type ions, which has severely affected cost of ownership.

Borohydrides

Borohydride materials such as $B_{10}H_{14}$ (decaborane) and $B_{18}H_{22}$ (octadecaborane) have attracted interest as ion implantation source materials. Under the right conditions, these materials form the ions $B_{10}H_x^+$, $B_{10}H_x^-$, $B_{18}H_x^+$ and $B_{18}H_x^-$. When implanted, these ions enable very shallow, high dose P-type implants for shallow junction formation in CMOS manufacturing. Since these materials are solid at room temperature, they must be vaporized and the vapor introduced into the ion source for ionization. They are low-temperature materials (e.g., decaborane melts at 100 C, and has a vapor pressure of approximately 0.2 Ton at room temperature; also, decaborane dissociates above 350 C), and hence must be used in a cold ion source. They are fragile molecules which are easily dissociated, for example, in hot plasma sources.

Contamination Issues of Borohydrides

Boron hydrides such as decaborane and octadecaborane present a severe deposition problem when used to produce ion beams, due to their propensity for readily dissociating within the ion source. Use of these materials in Bernas-style arc discharge ion sources and also in electron-impact ("soft") ionization sources, have confirmed that boron-containing deposits accumulate within the ion sources at a substantial rate. Indeed, up to half of the borohydride vapor introduced into the source may stay in the ion source as dissociated, condensed material. Eventually, depending on the design of the ion source, the buildup of condensed material interferes with the operation of the source and necessitates removal and cleaning of the ion source.

Contamination of the extraction electrode has also been a problem when using these materials. Both direct ion beam strike and condensed vapor can form layers that degrade operation of the ion beam formation optics, since these boron-containing layers appear to be electrically insulating. Once an electrically insulating layer is deposited, it accumulates electrical charge and creates vacuum discharges, or so-called "glitches", upon breakdown. Such instabilities affect the precision quality of the ion beam and can contribute to the creation of contaminating particles.

SUMMARY OF THE INVENTION

Objects of this invention are to provide a method and apparatus for producing ions beams without disturbance in the stability of the ion beam by electric discharges at the extraction electrode and to provide a method and apparatus for producing an ion beam which increases service lifetime and reduces equipment down time.

The invention features an extraction electrode for extracting ions from the ion source in which the electrode includes an active thermal control system.

The invention also features in-situ cleaning procedures and apparatus for an ion source and associated extraction electrodes and similar components of the ion-beam producing system, which periodically chemically remove deposits, increasing service lifetime and performance, without the need to disassemble the system.

The invention also features an actively heated ion extraction electrode which consists of a material which reduces the frequency and occurrence of electrical discharges, preferably this material being a metal.

Another feature is, in general, heating an extraction electrode above the condensation temperature of feed materials to an ion source, in preferred cases the electrode being comprised of metal, preferably aluminum or molybdenum.

The invention also features an ion extraction electrode comprised of aluminum, suitable for in situ reactive gas cleaning. Preferred embodiments include provisions for active temperature control of the extraction electrode adapted to the type of ion source with which the electrode is constructed to operate. Embodiments feature active heating of the extraction electrode for operation with cool-operating ion sources, active cooling of the extraction electrode for operation with hot-operating ion sources, and both active heating and cooling of the extraction electrode for selective operation with cool and hot-operating ion sources.

These and other innovations of the invention may include one or more of the following features:

A supply of a reactive gas is provided and introduced into the ion source, and the ion source and extraction electrode are cleaned in situ through exposure to reactive products from that supply such as atomic fluorine, F, or molecular fluorine, $F_2$; the atomic or molecular fluorine is injected into the ion source from a remote plasma source; the ion source and extraction electrode are cleaned through exposure to gaseous $ClF_3$ flowing from a remote supply; reactive components of the ionization apparatus are shielded from reactive gas during the cleaning phase of operation; the ion source is fabricated of aluminum; the extraction electrode is fabricated of aluminum; the front face of the extraction electrode is devoid of sharp or rough features; the plates of the extraction electrode are actively temperature controlled; the plates of the extraction electrode are actively heated; heating of the extraction electrode is radiative or is resistive; the plates of the extraction electrode in other situations are actively cooled.

Another feature is the use of the features described with apparatus suitable to form "cluster" or "molecular" ion beams, of feed material that is particularly subject to thermal breakdown and deposit.

While most ion implantation experts would agree that the use of borohydrides to form "cluster" ion beams such as $B_{10}H_x^+$ and $B_{18}H_{18}^+$ is very attractive for shallow junction formation, means to ionize and transport these large molecules have presented problems. For example, U.S. Pat. Nos. 6,288,403 and 6,452,338 describe ion sources which have successfully produced decaborane ion beams. However, such decaborane ion sources have been found to exhibit particularly short service life as compared to other commercial ion sources used in ion implantation. This short service life has been primarily due to the accumulation of boron-containing deposits within the ion source, and the deposition of insulating coatings on the ion extraction electrode, which has lead to beam instabilities requiring implanter shut down and maintenance.

According to another feature, means are provided to substantially reduce the deposition of such deposits in the borohydride ion source and on the ion extraction electrode, and means are provided to clean deposits on these components without removing them from the ion implanter, i.e., in-situ. This invention enables the commercial use of borohydride cluster beams in semiconductor manufacturing with long service lifetime.

A particular aspect of the invention is a system for generating an ion beam comprising an ion source in combination with an actively temperature-controlled extraction electrode and a reactive gas cleaning system, the ion source comprising an ionization chamber connected to a high voltage power supply and having an inlet for gaseous or vaporized feed materials, an energizeable ionizing system for ionizing the feed material within the ionization chamber and an extraction aperture that communicates with a vacuum housing, the vacuum housing evacuated by a vacuum pumping system, the extraction electrode disposed in the vacuum housing outside of the ionization chamber, aligned with the extraction aperture of the ionization chamber and adapted to be maintained at a voltage below that of the ionization chamber to extract ions through the aperture from within the ionization chamber, and the reactive gas cleaning system operable when the ionization chamber and ionizing system are de-energized to provide a flow of reactive gas through the ionization chamber and through the ion extraction aperture to react with and remove deposits on at least some of the surfaces of the ion generating system.

Preferred embodiments of this aspect have one or more of the following features.

The system is constructed for use in implanting ions in semiconductor wafers, the ionization chamber having a volume less than about 100 ml and an internal surface area of less than about 200 cm$^2$.

The system is constructed to produce a flow of the reactive gas into the ionization chamber at a flow rate of less than about 2 Standard Liters Per Minute.

The extraction electrode is constructed to produce a beam of accelerated ions suitable for transport to a point of utilization.

The extraction electrode is located within a path of reactive gas moving from the extraction aperture to the vacuum pumping system so that the extraction electrode is cleaned by the reactive gas.

The extraction electrode is associated with a heater to maintain the electrode at elevated temperature during extraction by the extraction electrode of ions produced in the ionization chamber, e.g. above the condensation temperature, below the disassociation temperature, of solid-derived, thermally sensitive vapors.

The extraction electrode is associated with a cooling device, e.g. when the electrode is formed of thermally sensitive material and is used with a hot ion source.

The extraction electrode has a smooth, featureless aspect.

The reactive gas cleaning system comprises a plasma chamber, the plasma chamber arranged to receive a feed gas capable of being disassociated by plasma to produce a flow of reactive gas through a chamber outlet, and a conduit for transporting the reactive gas to the ionization chamber.

The plasma chamber is constructed and arranged to receive and disassociate a compound capable of being disassociated to atomic fluorine, for instance $NF_3$, $C_3F_8$ or $CF_4$.

The reactive gas cleaning system is constructed and arranged to share a service facility associated with the ion source.

The system is constructed to direct an ion beam through a mass analyzer, in which the reactive gas cleaning system is constructed and arranged to share a service facility with the mass analyzer.

The reactive gas cleaning system comprises a conduit from a container of pressurized reactive gas, for instance $ClF_3$.

The system is in combination with an end-point detection system adapted to at least assist in detecting substantial completion of reaction of the reactive gas with contamination on a surface of the system for generating an ion beam.

The end point detection system comprises an analysis system for the chemical makeup of gas that has been exposed to the surface during operation of the reactive gas cleaning system.

A temperature detector is arranged to detect substantial termination of an exothermic reaction of the reactive gas with contamination on a surface of the system.

The energizeable ionizing system includes a component within or in communication with the ionization chamber that is susceptible to harm by the reactive gas and means are provided to shield the component from reactive gas flowing through the system.

The means to shield the component comprises an arrangement for producing a flow of inert gas, such as argon, past the component.

The means for shielding a component comprises a shield member that is impermeable to the reactive gas.

The system is constructed to operate with reactive halogen gas as the reactive gas and the extraction electrode and associated parts comprise aluminum (Al) or alumina ($Al_2O_3$).

The ion source is constructed to produce ions within the ionization chamber via an arc-discharge, an RF field, a microwave field or an electron beam.

The system is associated with a vaporizer of condensable solid feed material for producing feed vapor to the ionization chamber.

The ion source is constructed to vaporize feed material capable of producing cluster or molecular ions, and the ionization system is constructed to ionize the material to form cluster or molecular ions for implantation.

The vacuum housing of the system is associated with a pumping system comprising a high vacuum pump capable of producing high vacuum and a backing pump capable of producing vacuum, the high vacuum pump operable during operation of the ion source, and being capable of being isolated from the vacuum housing during operation of the reactive cleaning system, the backing pump operable during operation of the reactive gas cleaning system.

The system is associated with an ion implantation apparatus, the apparatus constructed to transportions following the extraction electrode implantation station within a vacuum chamber. In preferred embodiments an isolation valve is included for isolating the implantation station from the ionization chamber and the extraction electrode during operation of the reactive gas cleaning system.

The ion source is constructed and adapted to generate dopant ions for semiconductor processing, and the reactive gas cleaning system is adapted to deliver fluorine, F, or chlorine, Cl, ions to the ionization chamber or the extraction electrode for cleaning deposits from a surface.

The ion source is adapted to be temperature-controlled to a given temperature.

The ion source is adapted to generate a boron-containing ion beam; in preferred embodiments the boron-containing ion beam is generated by feeding vaporized borohydride material into the ion source, especially either decaborane, $B_{10}H_{14}$ or octadecaborane, $B_{18}H_{22}$.

The ion source is adapted to generate arsenic-containing ion beams.

The ion source is adapted to generate phosphorus-containing ion beams.

The ionization chamber of the ion source comprises aluminum.

The ionization chamber of the ion source or the extraction electrode comprises a material resistant to attack by halogen gases such as fluorine, F.

Another particular aspect of the invention is a method of in-situ cleaning using the system of any of the foregoing description, or of an ion source and temperature-controlled ion extraction electrode associated with an ion implanter, in which reactive halogen gas is flowed into an ion source while the ion source and ion extraction electrode are de-energized and under vacuum.

Embodiments of this aspect have one or more of the following features.

The reactive halogen gas is fluorine, F.

The reactive halogen gas is chlorine, Cl.

The fluorine gas is introduced into the ion source from a remote plasma source.

The fluorine gas is produced in the remote plasma source by an $NF_3$ plasma.

The fluorine gas is produced in the remote plasma source by a $C_3F_8$ or $CF_4$ plasma.

The reactive halogen gas is $ClF_3$.

The cleaning procedure is conducted to remove deposits after the ion source has ionized decaborane, $B_{10}H_{14}$.

The cleaning procedure is conducted to remove deposits after the ion source has ionized octadecaborane, $B_{18}H_{22}$.

The cleaning procedure is conducted to remove deposits after the ion source has ionized arsenic-containing compounds, such as arsine, $AsH_3$, or elemental arsenic, As.

The cleaning procedure is conducted to remove deposits after the ion source has ionized phosphorus-containing compounds, such as elemental phosphorus, P, or phosphine, $PH_3$.

The cleaning procedure is conducted to remove deposits after the ion source has ionized antimony-containing compounds, such as trimethylantimony, $Sb(CH_4)_3$, or antimony pentaflouride, $SbF_5$.

The cleaning procedure is conducted for an ion source in situ in an ion implanter between changing ion source feed materials in order to implant a different ion species.

Another particular aspect of the invention is an ion implantation system having an ion source and an extraction electrode for extracting ions from the ion source, in which the extraction electrode includes a heater constructed to maintain the electrode at an elevated temperature sufficient to substantially reduce condensation on the electrode of gases or vapors being ionized and products produced therefrom. Another aspect is such an extraction electrode, per se, useful in such system.

Embodiments of these aspects have one or more of the following features.

The electrode comprises aluminum.

The electrode comprises molybdenum.

The electrode is heated by radiative heating.

The electrode is heated by a resistive heating element).

The temperature of the electrode is controlled to a desired temperature; in embodiments the temperature is between 150 C and 250 C.

The electrode is periodically cleaned in situ by exposure to reactive halogen-containing gas.

The electrode comprises at least two electrode elements constructed and arranged in close succession along a beam path from the ion source, the electrode elements having elongated, slot-form beam apertures through which a ribbon-like ion beam passes, the heater including heater portions disposed on each of the long sides of the slot-form apertures. In some preferred forms at least one electrode element comprises an inner portion defining its beam aperture and an outer portion in heat conductive relation to the inner portion, the outer portion defining a heat receptor face for absorbing radiated heat. In some preferred forms, at least one of the electrode elements comprises a portion that defines its beam aperture, this portion being exposed to be a receptor for absorbing radiated heat.

The heater comprises a continuous electrical resistance heating element. In preferred forms this heating element is arranged to heat multiple electrode elements by radiative heating. Preferably the heating element is sealed within a protective tube to form a tubular heater, the tube constructed to be heated internally by the heating element and the tube exposed to heat the electrode elements by radiative heating, and preferably the tube being of circular configuration and disposed to surround beam-path defining portions of the electrode elements.

In preferred forms an electrode element comprises an inner portion defining its beam aperture and an outer portion in heat conductive relation to the inner portion, the outer portion defining a heat receptor face for absorbing radiated heat, a tubular heater surrounding the beam path and opposed to the receptor face in radiant heating relationship. In one preferred form, a pair of electrode elements of the extraction electrode each comprises an inner portion defining its beam aperture and an outer portion in heat conductive relation to the inner portion, the outer portions defining heat receptor faces for absorbing radiated heat, the tubular heater disposed between, and in radiant heating relationship to the receptor faces of these two electrode elements. This arrangement may be employed in a two-electrode element configuration or in a configuration having more than two electrode elements. In one preferred form, besides the pair of electrode elements there is at least a third electrode element disposed between the pair, the third electrode element comprising a portion that defines its beam aperture, this portion exposed to be a heat receptor for heat radiating radially inwardly from the surrounding tubular heater.

Another aspect of the invention is a method of in-situ cleaning of an ion extraction electrode of any of the systems described or a temperature-controlled ion extraction electrode which is associated with an ion implanter, in which reactive halogen gas is flowed over the ion extraction electrode while the electrode is in situ and under vacuum. Another aspect is a temperature-controlled ion extraction electrode constructed for in situ cleaning by such gas.

Embodiments of this aspect have one or more of the following features.

The reactive halogen gas is fluorine, F or chlorine, Cl.

Fluorine gas is introduced from a remote plasma source into a vacuum housing in which the extraction electrode resides.

Fluorine gas is produced in the remote plasma source by a $NF_3$ plasma.

Fluorine gas is produced in the remote plasma source by a $C_3F_8$ or $CF_4$ plasma.

The reactive gas is $ClF_3$.

The cleaning procedure is conducted to remove deposits after the ion source has ionized decaborane, $B_{10}H_{14}$.

The cleaning procedure is conducted to remove deposits after the ion source has ionized octadecaborane, $B_{18}H_{22}$.

The cleaning procedure is conducted to remove deposits after the ion source has ionized arsenic-containing compounds, such as arsine, $AsH_3$, or elemental arsenic, As.

The cleaning procedure is conducted to remove deposits after the ion source has ionized phosphorus-containing compounds, such as elemental phosphorus, P, or phosphine, $PH_3$.

The cleaning procedure is conducted between changing ion source feed materials in order to implant a different ion species.

Ion Source and Ion Extraction Electrode Provided with In-Situ Etch Cleaning

According to a preferred embodiment, the in situ chemical cleaning process utilizes atomic F gas, to effectively clean deposits from the ion source and from the ion extraction electrode, while the ion source and extraction electrode remain installed in the ion beam-producing system. In a preferred embodiment an electron impact ion source with cooled chamber walls is employed. Preferably, the ionization chamber and source block and the extraction electrode, comprise aluminum, i.e. are fabricated of aluminum or of an aluminum containing alloy, enabling aluminum fluoride to be created on the aluminum surfaces to act as a passivating layer, that prevents further chemical attack by F. Insulators of the assembly are preferably formed of alumina ($Al_2O_3$) which is also resistant to attack by F.

One embodiment of this feature uses the outlet of a remote reactive gas source directly coupled to an inlet to the ion source.

In a preferred embodiment the reactive gas source is a plasma source which introduces an etch feed gas, such as $NF_3$ or $C_3F_8$, into a supplemental ionization chamber. By sustaining a plasma in the supplemental chamber, reactive gases such as F and $F_2$ are produced, and these reactive gases, introduced to the main ion source, chemically attack the deposited materials. By-products released in the gas phase are drawn through the extraction aperture of the ionization chamber, past the extraction electrode, and are pumped away by the vacuum system of the installation, cleaning the chamber and the ion extraction electrode.

Deposition Model

It is a generally observed principle of physics that when two objects interact, there can be more than one outcome. Furthermore, one can assign probabilities or likelihoods to each outcome such that, when all possible outcomes are considered, the sum of their individual probabilities is 100%. In atomic and molecular physics such possible outcomes are sometimes called "channels" and the probability associated with each interaction channel is called a "cross section". More precisely, the likelihood of two particles (say, an electron and a gas molecule) interacting with each other at all is the "total cross section", while the likelihoods of certain types of interactions (such as the interaction represented by the electron attaching itself to the gas molecule thus forming a negative ion, or by removing an electron from the gas molecule thus forming a positive ion, or by dissociating the molecule into fragments, or by elastically scattering from the molecule with no chemical change of the molecule) are the "partial cross sections".

This state of affairs can be represented by a mathematical relation which expresses the total cross section $\sigma_T$ as the sum of its i partial cross sections:

$$\sigma_T = \sigma_1 + \sigma_2 + \sigma_3 + \ldots, \text{ or} \tag{1}$$

$$\sigma_T = \Sigma \sigma_i \tag{2}$$

The ion sources used in ion implanters typically display modest ionization fractions. That is, only a small fraction (from a few percent to a few tens of percent) of the gas or vapor fed into the ion source is ionized. The rest of the gas or vapor typically leaves the source in the gas phase, either in its original state or in some other neutral state. That is, the ionization cross section is much smaller than the total cross section. Of course, some of the gas components can stay in the ion source as deposited materials, although this tends to be a small percentage of the total for the commonly used implantation feed materials. While feed materials vaporized by heating such as elemental As or P more readily produce deposits than do normally gaseous feed materials, the heated vapor tends to stay in the gas phase if the walls of the ion source are at a higher temperature than the vaporizer, and do not pose a severe deposition risk. However, significant detrimental deposits may still be produced when producing boron beams from gaseous BF3 feed gas, for example, as well as beam from In and Sb.

Also, in general, over time, deposits of condensable materials do occur on the extraction electrode and on certain other components of ion producing systems, affecting their operational life before disassembly and cleaning.

Furthermore, in the case of the borohydrides, the total cross section representing all interactions with the ionizing medium (i.e., electrons in the ion source) appears large, the ionization cross section is small, and by far the largest cross section represents the channel for dissociation of the borohydride molecules into non-volatile fragments, which then remain on surfaces in the ion source. The problem of deposition of these fragments is adversely influenced by cooling of the ionization chamber walls in an effort to reduce thermal decomposition of the feed material. In sum, it appears that deposition from borohydrides of boron-containing fragments in the source is a fundamental phenomenon which would be observed in any type of ion source acting on this material, and solution to the problem is of broad, critical interest to the semiconductor manufacturing industry. It is also found that contamination of the ion extraction electrode with insulative deposits is a problem with borohydrides, as described more fully below.

Electron Impact Ion Source Suitable for Borohydrides

An ion source particularly suitable for borohydrides is an electron-impact ion source which is fully temperature-controlled (see U.S. Pat. Nos. 6,452,338 and 6,686,595; also International Application no. PCT/US03/20197, each herein incorporated by reference); also see FIG. 7. Instead of striking an arc-discharge plasma to create ions, the ion source uses a "soft" electron-impact ionization of the process gas by energetic electrons injected in the form of one or more focused electron beams. This "soft" ionization process preserves these large molecules so that ionized clusters are formed. As seen in FIG. 7, solid borohydride material is heated in a vaporizer and the vapor flows through a vapor conduit to a metal chamber, i.e., the ionization chamber. An electron gun located external to the ionization chamber delivers a high-current stream of energetic electrons into the ionization chamber; this electron stream is directed roughly parallel and adjacent to an extended slot in the front of the chamber. Ions are extracted from this slot by an ion extraction electrode, forming an energetic ion beam. During transport of the sublimated borohydride vapor to the ionization chamber all surfaces are held at a higher temperature than that of the vaporizer (but well below the temperature of dissociation), to prevent condensation of the vapor. Many hours of testing have confirmed that the surfaces of the vapor feed and valves indeed remain clean when such temperature control is implemented.

Extension of Ion Source Lifetime with Decaborane Between Cleanings

The impact of vapor flow rate on source lifetime (maintenance interval) was studied in a quantitative manner. The electron impact ion source was run continuously with decaborane feed material under controlled conditions at a given vapor flow, until it was determined that the buildup of material was causing a significant decrease in decaborane beam current. Five different flow rates were tested, ranging from about 0.40 sccm to 1.2 sccm. This resulted in mass-analyzed decaborane beam currents ($B_{10}H_x^+$) ranging from about 150 µA to 700 µA. It is noted that typical feed gas flows in ion sources used in ion implantation range from 1 to about 3 sccm, so this test range is considered a "low" flow regime.

The results of these lifetime tests are summarized in FIG. 5. It suggests a simple model, a hyperbolic function. This is not unexpected; if one assumes zero vapor flow, then the source lifetime would, in principle, diverge; and if one assumes very high vapor flow, then source lifetime would decrease asymptotically to zero. Thus, the model can be expressed by:

(flow rate)×(flow duration)=constant. (3)

Equation (3) simply states that lifetime (i.e., flow duration) is inversely proportional to flow rate; the constant is the amount of deposited material. If equation (3) is accurate, then the fraction of deposited material is independent of the rate of flow of material, which is consistent with our model describing a fixed cross section for dissociation and subsequent deposition. These data show that, using the electron impact ion source with about 0.5 sccm decaborane vapor flow, dedicated decaborane operation can be sustained for more than 100 hours. While this is acceptable in many cases, in commercial semiconductor fabrication facilities, source lifetimes of well over 200 hours are desired. When the ion source is used in conjunction with the novel in-situ cleaning procedure of the present invention, greatly extended source lifetimes are achieved. The in situ cleaning includes cleaning the ion extraction electrode assembly as has been fully described below.

Advantages of Certain Features of In-Situ Ion Source and Ion Extraction Electrode Chemical Cleaning There are several very important advantages to using a supplemental ion source to produce the reactive gas for in situ cleaning of the ion source and the ion extraction electrode. Such plasma sources have been developed for effluent removal applications from process exhaust systems (such as the Litmus 1501 offered by Advanced Energy, Inc.), and for cleaning large CVD process chambers (such as the MKS Astron reactive gas generator), but to the inventors' knowledge it has not been previously recognized that a remote reactive gas generator could be usefully applied to in situ cleaning the ionization chamber of an ion source and the extraction electrode used to generate an ion beam. Remote reactive gas generators such as the MKS Astron have been used to clean process chambers (i.e., relatively large vacuum chambers wherein semiconductor wafers are processed), an application which uses high flows of feed gas (several Standard Liters per Minute (SLM)), and high RF power applied to the plasma source (about 6 kW). The system of the present invention can employ a much more modest feed gas rate, e.g. less than about 0.5 SLM of $NF_3$, and much less RF power (less than about 2.5 kW), for the very small volume of the ionization chamber of the ion source being cleaned (the volume of the ionization chamber for an implanter of semiconductor wafers is typically less than about 100 ml, e.g. only about 75 ml, with a surface area of less than about 200 $cm^2$, e.g. about 100 $cm^2$). The reactive gas flow into the ionization chamber is less than about 2 Standard Liters Per Minute.

One might think it strange to use an external ion source to generate plasma by-products to introduce into the main ion source of the system; why not just introduce the (e.g., $NF_3$) gas directly into the main ion source to create the plasma by-products within that source directly? The reasons seem not obvious. In order to achieve etch rates which far exceed deposition rates from the feed gas during a small fraction of the uptime (productive period) of the ion implantation system, it is found that the reactive gas must be produced and introduced at relatively very high flows into the small ionization chamber, e.g., flows on the order of $10^2$ to $10^3$ sccm, compared to typical feed flow rates for the main ion source for ion implantation in the range of 1-3 sccm; such high flows would raise the pressure within the ionization chamber of the main ion source far beyond that for which it is designed to operate for ion implantation. Furthermore, sustaining a high-density $NF_3$ plasma within the main ion source would etch away sensitive components, such as hot tungsten filaments. This is because halogen gases etch refractory metals at a high rate which increases exponentially with temperature. (For example, Rosner et al. propose a model for F etching of a tungsten substrate:

Rate(microns/min)=$2.92 \times 10^{-14} T^{1/2} N_F e^{-3900/T}$, (4)

Where $N_F$ is the concentration of fluorine in atoms per $cm^3$, and T is the substrate temperature in degrees Kelvin.)

Since virtually all ion sources for ion implantation incorporate hot filaments, and since in many cases the ion source chambers are also made of refractory metals such as Mo and W, or graphite (which is aggressively attacked by F), these ion sources would quickly fail under high temperature operating conditions, making the etch cleaning process unusable.

In the presently preferred embodiment, atomic fluorine is caused to enter the cold ionization chamber of the de-energized main ion source at a flow rate of 100 sccm or more, and the total gas flow into the ionization chamber is 500 sccm or more. Under these conditions, the gas pressure within the ionization chamber is about 0.5 Torr, while the pressure within the vacuum source housing of the implanter is a few tens of milliTorr or more. In a preferred mode of operation, preceding the cleaning phase, an isolation valve is closed between the vacuum housing of the ion source and the implanter vacuum system, and the turbo-molecular pump of the ion source is isolated. The housing of the ion source, including the space containing the ion extraction electrode, is then pumped with high-capacity roughing pumps of the vacuum system (i.e., the pumps which normally back the turbomolecular pumps and evacuate the vacuum system down to a "rough" vacuum).

A different embodiment of a related etch clean process, shown in FIG. 5, utilizes a "dry etch" gas such as $ClF_3$. As has previously been observed, the $ClF_3$ molecule breaks up on contact with deposited surfaces to be cleaned; thus, atomic fluorine and chlorine are released without requiring the generation of a plasma. While handling of $ClF_3$ gas requires special equipment due to its highly reactive nature, it in principle can simplify the chemical cleaning process to the extent of not requiring an ancillary reactive gas plasma source. Since toxic gases are routinely fed into an ion source for an ion implanter, much of the equipment is already constructed to be "toxic-gas-friendly", and a separate gas distribution system incorporating ClF$_3$ can be added in a straightforward manner.

Advantages of the in-situ chemical cleaning of the ion source and ion extraction electrode for an ion implanter include: a) extending source life to hundreds, or possibly thousands, of hours before service is required; b) reducing or eliminating cross-contamination brought about by a species change, for example, when switching from octadecaborane ion implantation to arsenic or phosphorus ion implantation, and from arsenic or phosphorus ion implantation to octadecaborane ion implantation; and c) sustaining peak ion source performance during the service life of the ion source.

For example, performing a 10 minute chemical cleaning protocol every eight hours (i.e., once every shift change of operating personnel) and between each species change would have a minimal impact on the uptime of the implanter, and would be acceptable to a modern semiconductor fabrication facility.

Endpoint Detection

It is realized to be beneficial to provide endpoint detection during the cleaning process, so that quantitative information on the efficacy and required duration of the cleaning process may be generated, and the reproducibility of the chemical cleaning process may be assured. FIG. 3 shows a differentially-pumped quadrupole mass analyzer (Residual Gas Analyzer, RGA) sampling the cleaning process. By monitoring the concentrations of cleaning gas products such as F, Cl, BF$_3$, PF$_3$, AsF$_3$, AlF$_3$, WF$_6$, for example, the cleaning process may be tuned and verified. Alternatively, optical means of monitoring the process may be utilized. An FTIR optical spectrometer can monitor the gases resident in the vacuum housing of the ion source of the implanter, through a viewport. This non-invasive (ex-situ) means to identify chemical species may be preferable to in-situ monitoring devices in certain cases. Alternatively, see FIG. 4, an extractive FTIR spectrometer may be coupled to the source vacuum housing for endpoint monitoring. A novel means to accomplish endpoint detection consists of monitoring the temperature of the ionization chamber during cleaning. Since the chemical reaction is exothermic, energy is released during the reaction, elevating the chamber temperature. This effect can in principle be used to establish when the reaction rate is diminished.

Novel Ion Extraction Electrode

Borohydrides such as decaborane and octadecaborane are thermally sensitive materials. They vaporize and condense at temperatures between 20 C and 100 C. It is therefore important to maintain all surfaces with which these materials come into contact at a temperature higher than the vaporizer temperature (but below the temperature at which they dissociate), to prevent condensation. We have found that contamination of the extraction electrode is a problem when using such a borohydride. Both direct ion beam strike and condensed feed vapor or products of its molecular disassociation can degrade operation of the ion beam formation optics, since these boron-containing layers appear to be electrically insulating. Once electrically insulating layers are deposited, they acquire an electrical charge ("charge up") and create vacuum discharges, or "glitches", upon electrical breakdown. Such a discharge creates instabilities in the ion beam current and can contribute to the creation of particles that may reach a process chamber to which the ion beam is directed. An ion implanter which has an ion beam-producing system that experiences many glitches per hour is not considered production-worthy in modern semiconductor fabrication facilities. Furthermore, even in absence of such discharges, as insulating coatings become thicker, the electric charge on electrode surfaces create unwanted stray electric fields which can result in beam steering effects, creating beam loss and may adversely affect ion beam quality.

Discovery of new information has led to a robust solution to this problem. Most implanter ion extraction electrodes are made of graphite. Graphite has been seen to have many advantages in this application, including low materials cost, ease of machining, high electrical conductivity, low coefficient of thermal expansion, and good mechanical stability at high temperatures. However, using a graphite extraction electrode, instabilities were observed after producing an ion beam of borohydrides. It was suspected that the surfaces of the electrode had become insulating. Samples of the electrode deposits were collected and a chemical analysis performed by x-ray fluorescence spectroscopy. The study revealed a chemical stoichiometry consistent with a boron-carbon compound of the form $B_2C$, which was found to be insulating. In addition, it appeared that metal surfaces in the vicinity of the ion source, including the front plate (i.e., the ion extraction aperture plate) of the ion source also had deposited insulating coatings after long use. It was conceived to fabricate the electrode of aluminum, and provide radiant heaters to keep the electrode plates, i.e., the suppression and ground electrodes, at a well-controlled, elevated temperature (see FIGS. 9, 11) sufficiently high to prevent condensation of decaborane and octadecaborane. In addition, the suppression electrode, which faces the ion source, was fabricated of a single machined piece of aluminum, with a smooth, featureless aspect and all fasteners were located at the backside of the plates. This configuration dramatically reduced the number and severity of discharge points in the event that insulating coatings were formed, employing the principle that the electric field stress at a "point", or sharp feature, is many times greater than at a smooth surface.

The extraction electrode, thus produced, demonstrated excellent performance, and operated reliably for more than 100 hours (at least ten times as long as the graphite electrode) with very low glitch frequency. This great improvement is attributed to: i) Al construction (i.e., metal versus graphite), ii) Active heating and temperature control of the electrode plates, and iii) smooth electrode surfaces. It was found that operating the electrode plates at 200 C gave good results when running decaborane, significantly reducing the amount of deposited material. In general, the temperature of the extraction electrode should be kept below the dissociation temperature of the feed material. In the case of decaborane the temperature should be kept below 350 C, preferably in the range 150 C to 250 C. For octadecaborane operation, the temperature should not exceed 160 C, since chemical changes occur in octadecaborane above this temperature; when running octadecaborane, an extraction electrode temperature between 120 C and 150 C yields good results.

The radiative design shown in FIG. 11 demonstrated very good temperature uniformity. Incorporating resistive heaters, particularly using an aluminum electrode as illustrated in FIG. 12, can also yield good uniformity and results in a more compact design requiring less maintenance. A further design that incorporates desirable features from both of the designs of FIGS. 11 and 12 is described with reference to FIGS. 1A-1L.

For constructing a heated extraction electrode, other metals would also work, for example molybdenum. Molybdenum has the advantage of being refractory, so it can withstand very high temperatures. It also has good thermal conductivity. Aluminum, on the other hand, is a column III element like In and B of the periodic table, and therefore offers the advantage of being only a mild contaminant in silicon (it is a P-type dopant in silicon), while transition metals such as molybdenum are very detrimental to carrier lifetimes in integrated circuits. Aluminum is also not readily attacked by halogens, whereas transition metals such as molybdenum are susceptible to attack, particularly at elevated temperatures. The primary disadvantage of aluminum, however, is that it is not a high temperature material, and should be used below about 400 C.

For these reasons, depending upon the particular use, the heated electrode is constructed of a selected heat-resistant material, aluminum or an aluminum containing alloy often being preferred when used in association with in situ etch cleaning.

By providing the alternative of active electrode cooling as well as active heating, a temperature-controlled ion extraction electrode comprised of aluminum, suitable for halogen cleaning, may be used with different types of interchangeable ion sources, or with a multi-mode ion source. The aluminum electrode can be used with cool ion sources (during which the extraction electrode is heated to deter contamination, and avoid unstable operation), and with hot ion sources (during which the extraction electrode is cooled to keep its temperature below about 400 C, to maintain its dimensional stability.)

BRIEF DESCRIPTION OF THE DRAWINGS

FIG. 1A: Ion-extraction electrode assembly useful in the system of FIG. 1.

FIGS. 1B and 1C: Cross-sections taken on lines 1B and 1C, respectively, on FIG. 1A;

FIGS. 1G, 1H and 1I: Orthogonal views of heater of the assembly of FIG. 1A;

DETAILED DESCRIPTION

Novel Ion Beam-Generating System

Figure 1:
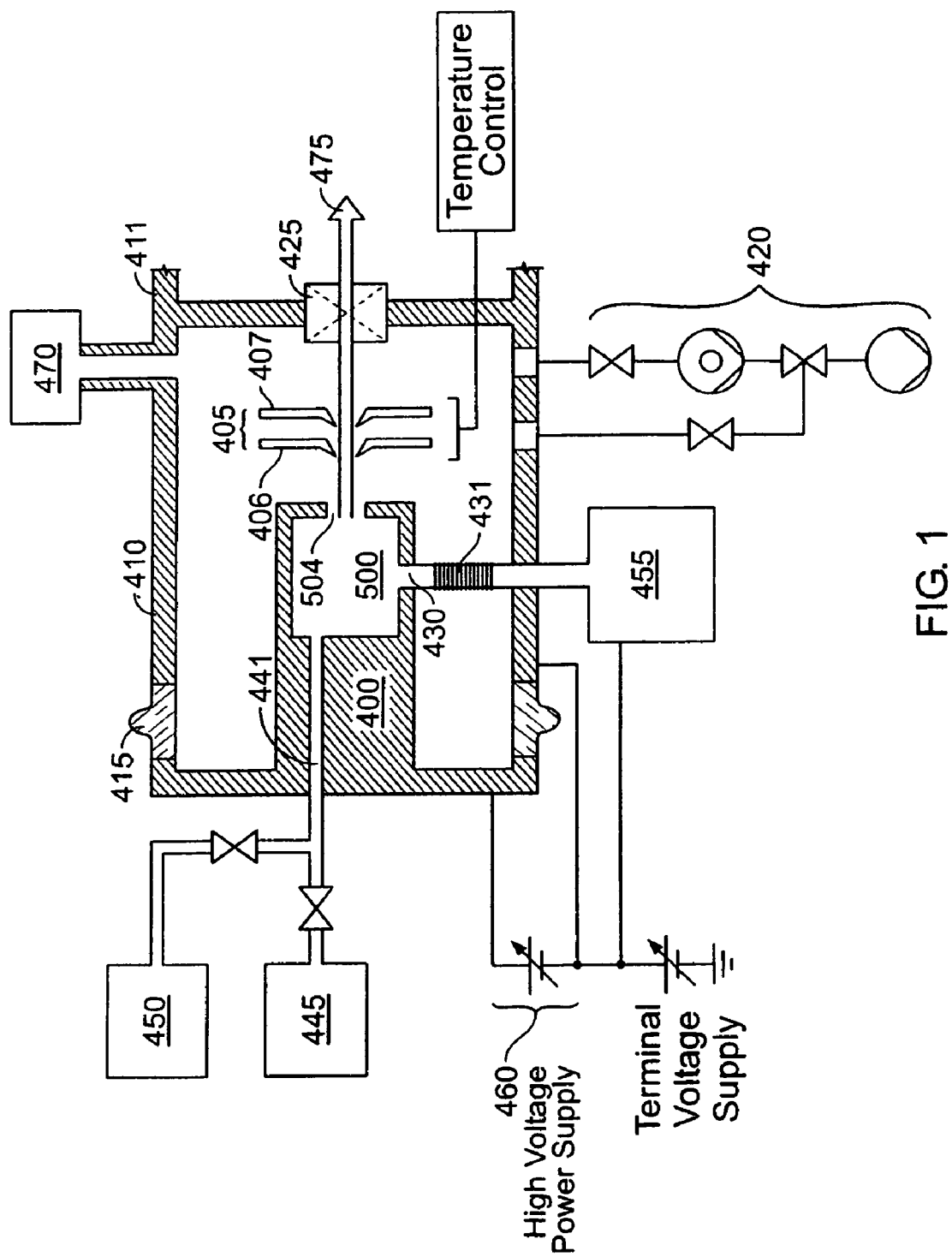
FIG. 1: Ion beam generation system incorporating reactive gas cleaning.
Figure 1D:
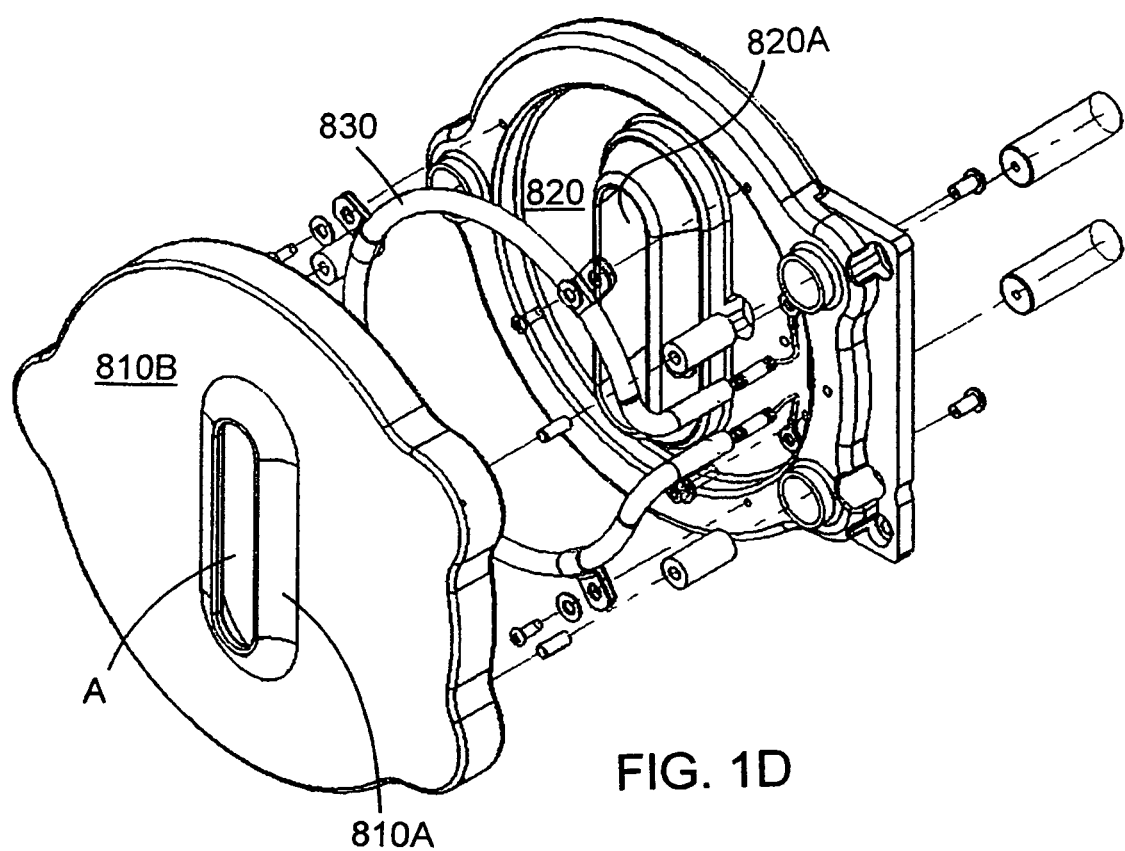
FIG. 1D: exploded view of the assembly.
Figure 1E:
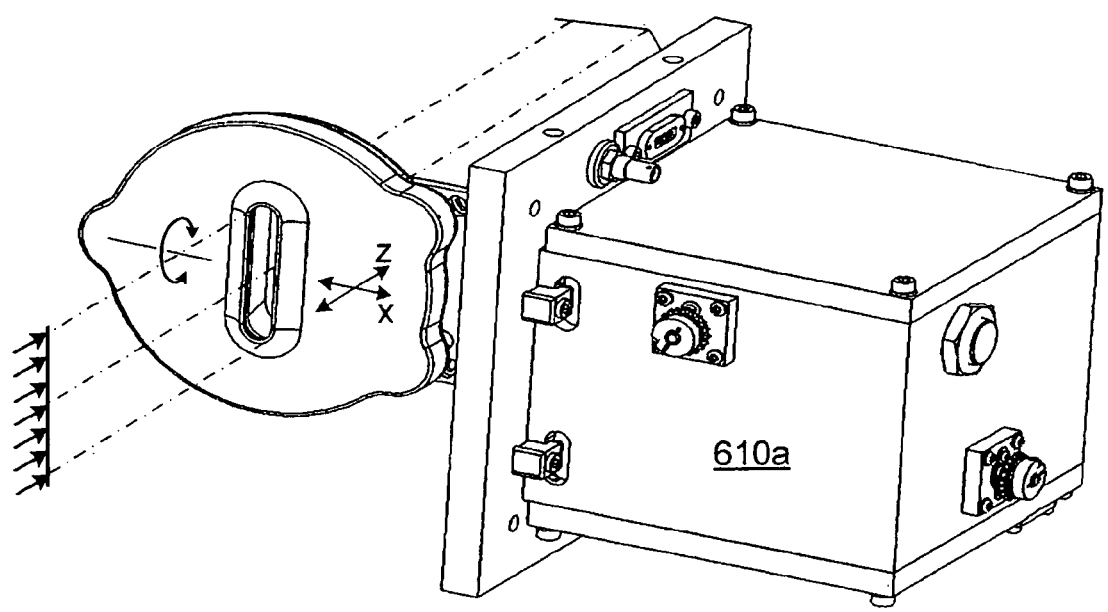
FIGS. 1E and 1F: perspective views of the assembly mounted on a manipulator.
Figure 1F:
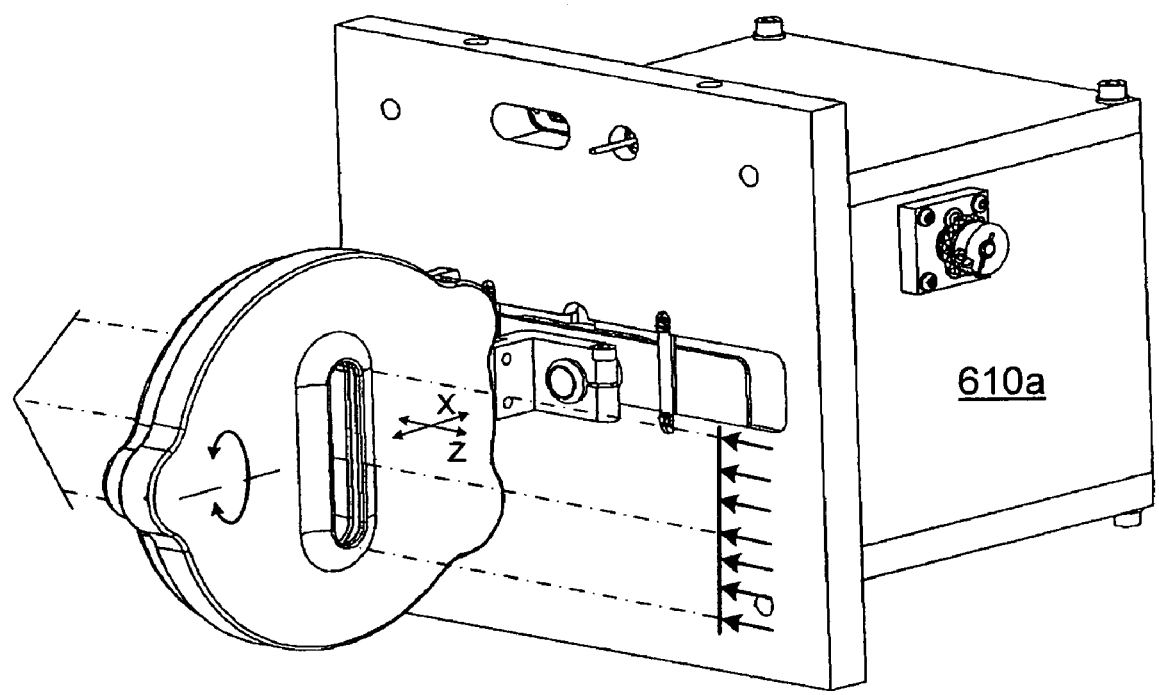
Figure 1J:
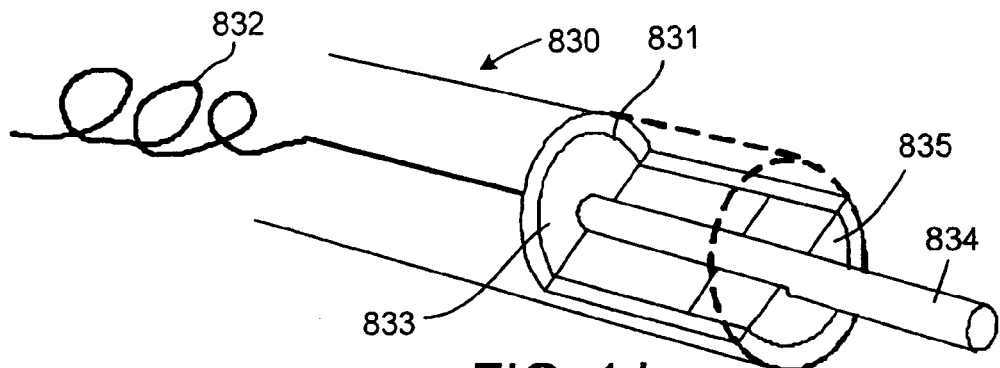
FIGS. 1J and 1K: cut away and side views of the end portion of the heater.
Figure 1K:
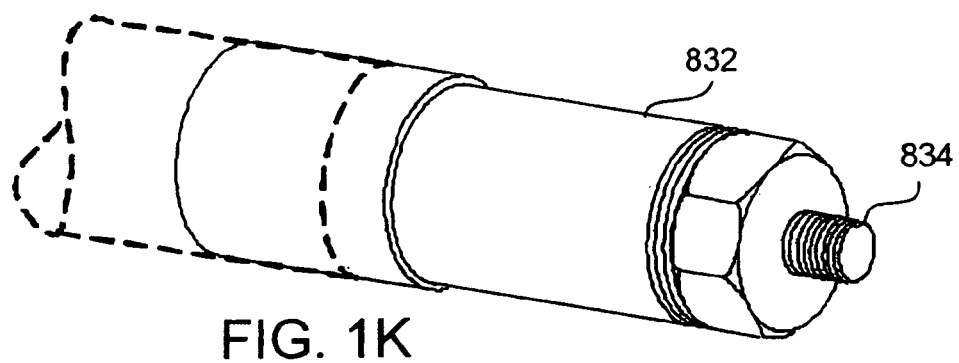

FIG. 1 shows an ion beam-generating system. As shown in this example, it is adapted to produce an ion beam for transport to an ion implantation chamber for implant into semiconductor wafers or flat-panel displays. Shown are ion source 400, extraction electrode 405, vacuum housing 410, voltage isolation bushing 415 of electrically insulative material, vacuum pumping system 420, vacuum housing isolation valve 425, reactive gas inlet 430, feed gas and vapor inlet 441, vapor source 445, feed gas source 450, reactive gas source 455, ion source high voltage power supply 460, and resultant ion beam 475. An ion beam transport housing is indicated at 411. The ion source 400 is constructed to provide cluster ions and molecular ions, for example the borohydride ions $B_{10}H_x^+$, $B_{10}H_x^-$, $B_{18}H_x^+$, and $B_{18}H_x^-$ or, or in addition, more conventional ion beams such as $P^+$, $As^+$, $B^+$, $In^+$, $Sb^+$, $Si^+$, and Ge. Ion source 400 may be a Bernas-style arc-discharge ion source, which is most commonly used for ion implantation, or a "bucket"-type water-cooled ion source which uses an immersed RF (radio frequency) antenna forming an RF field to create ions, a microwave ion source, or an electron-impact ionization source, for example. The gas and vapor inlet 441 for gaseous state feed material to be ionized is connected to a suitable vapor source 445, which may be in close proximity to gas and vapor inlet 441 or may be located in a more remote location, such as in a gas distribution box located elsewhere within a terminal enclosure. A terminal enclosure is a metal box, not shown, which encloses the ion beam generating system. It contains required facilities for the ion source such as pumping systems, power distribution, gas distribution, and controls. When mass analysis is employed for selection of an ion species in the beam, the mass analyzing system may also be located in the terminal enclosure.

In order to extract ions of a well-defined energy, the ion source 400 is held at a high positive voltage (in the more common case where a positively-charged ion beam is generated), with respect to the extraction electrode 405 and vacuum housing 410, by high voltage power supply 460. The extraction electrode 405 is disposed close to and aligned with the extraction aperture 504 of the ionization chamber. It consists of at least two aperture-containing electrode plates, a so-called suppression electrode 406 closest to ionization chamber 500, and a "ground" electrode 407. The suppression electrode 406 is biased negative with respect to ground electrode 407 to reject or suppress unwanted electrons which otherwise would be attracted to the positively-biased ion source 400 when generating positively-charged ion beams. The ground electrode 407, vacuum housing 410, and terminal enclosure (not shown) are all at the so-called terminal potential, which is at earth ground unless it is desirable to float the entire terminal above ground, as is the case for certain implantation systems, for example for medium-current ion implanters. The extraction electrode 405 may be of the novel temperature-controlled metallic design, described below.

(If a negatively charged ion beam is generated the ion source is held at an elevated negative voltage with other suitable changes, the terminal enclosure typically remaining at ground.)

Novel Actively Heated Extraction Electrode

The ion accelerating and ion beam forming effects ("ion optic effects") of extraction electrodes are well understood by those skilled in the design of ion implantation systems.

Actively temperature-controlled extraction electrode designs are shown in FIGS. 9, 9B, 9C, 11 and 12, described later herein. An actively heated extraction electrode arrangement of "sandwich" form, suitable for ion beams of decaborane and octadecaborane, is shown in FIGS. 1A to 1L, which will be described now.

Referring to FIGS. 1A to 1L, extraction electrode 805 is comprised of suppression electrode element 810 and ground electrode element 820 mounted in close succession along the ion beam path. The ions are drawn by electric field effects from the positively biased ion source 400, FIG. 1, to the extraction electrode 805. The ions propagate through electrode 805 along beam axis 530 as an energetic, focused, ribbon-form ion beam 475. The ground electrode is maintained at the potential of the surrounding vacuum housing 410 and establishes the potential of the ion beam as it proceeds beyond the extraction electrode. Suppression electrode 810, biased to a few thousand volts negative relative to the ground electrode, serves to suppress secondary electrons which are generated downstream from the suppression electrode due to beam strike. This prevents such energetic electrons from back-streaming into the positively-biased ion source 400.

The suppression electrode element 810 and ground electrode element 820 are fabricated of aluminum and have smooth, carefully polished surfaces to minimize local electric fields. The extraction optic component 805 comprised of these elements is mounted on a manipulator 610A, shown in FIGS. 1E and 1F. This manipulator is used e.g. to align electrode 805 with the ion source and downstream components and to vary the focal length of the ion optical system. As indicated, the manipulator enables linear adjustment in the X dimension, transverse to the short dimension of the slot-form aperture, and in the Z dimension, along the axis of the ion beam. It also enables rotation about the X axis.

Each electrode element, 810 and 820, is comprised of two portions, inner aperture-defining portion, 810A and 820A, and disc-form outer portion, 810B and 820B, respectively. Heater 830 is disposed ("sandwiched") between these electrode elements, but is spaced out of contact with them so that heat transfer from heater to electrode elements is by radiation. Inner portions 810A and 820A form elongated, slot-form apertures A in the electrode elements for passage of the ions from the ions source 400 and serve to establish the electric fields to which the ions are exposed. Outer portions 810B and 820B of the electrode elements serve multiple functions: they support the inner electrode portions, they serve as axially-directed, wide area heat receptors for absorbing heat that radiates generally axially from the radiant heater 830 which is disposed between them, and they define low-resistance thermal conductive paths by which heat can flow by conduction radially from the outer portions to the inner portions. In the preferred form shown, each electrode element is of one piece, machined of aluminum, and as such provides excellent heat conducting paths from its outer to its inner electrode portion. In other designs, the inner portions of the electrodes may be discretely formed as replaceable units and may be thermally connected to permanently mounted outer portions by heat conductive metal gaskets compressed between the two portions. Also, instead of the outer portions of the electrode elements being planar discs they may be of other heat receptive forms, such as of conical or of curved cross-section.

The radiant heater 830, mounted between the two outer electrode portions 810A and 820A, is configured to surround the inner electrode portions 810B and 820B and the ion beam path. In this implementation the heater is a circular tube heater, FIGS. 1A and 1F. Heater 830, of overall diameter greater than the long dimension L of the slot-form ion beam apertures A, surrounds the apertures. It is centered on beam axis 530. Heater 830 is comprised of a hollow outer, chemically-resistant radiating tube 831, e.g. of stainless steel such as Incaloy™. Inside of tube 831 is centered an electric resistance heating element 832, e.g. nichrome wire. The resistance wire is held in its central position by insulating material 833, for instance magnesium oxide, see FIG. 1J. Such heaters are available for instance as Watrod™ heaters, from Watlow. For protecting the heater wire from chemical vapor during reactive gas cleaning, glass hermetic end seals 835 are employed at the ends of the heater tube. Nickel plated steel end conductors 834 extend centrally through the seals, from the exterior to electrical connection with the resistance element 832 within the tube. With suitably chosen insulative standoffs, e.g. of alumina ($Al_2O_3$), and by employing stainless steel connectors, the entire extraction electrode unit is fluorine-resistant, and suitable for in situ cleaning by reactive gas.

Figure 1L:
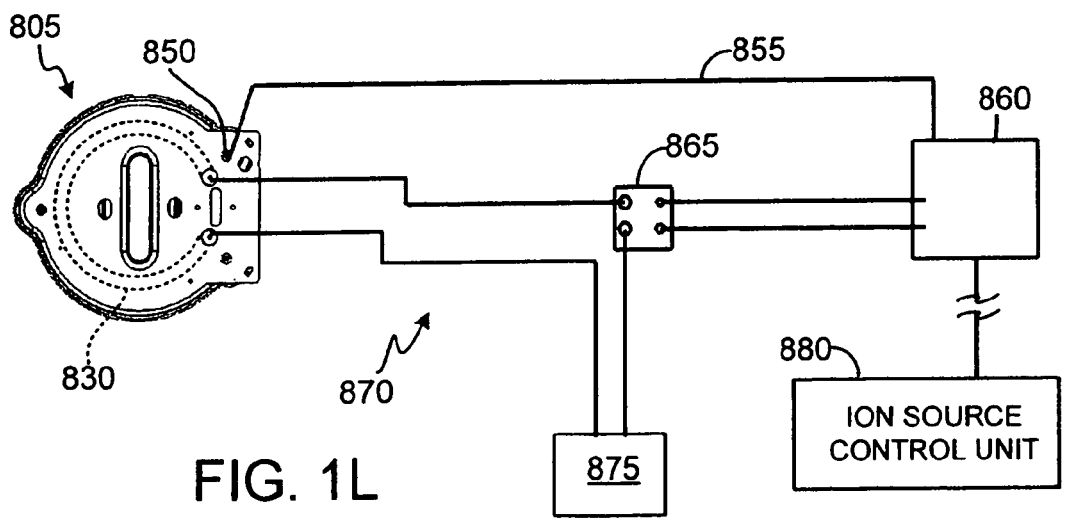
FIG. 1L: Heater control circuit.

An example of a suitable power control circuit for heater 830 is shown in FIG. 1L. Thermocouple 850 is connected with good thermal contact to a thermally representative portion of the extraction electrode assembly 805. Thermocouple 850 feeds back to a closed-loop PID controller, 860, e.g. Omron E5CK. Controller 860 is connected to solid state relay 865 of power circuit 870. In operation, the set point for heating the extraction electrode assembly is determined at the overall control unit 880 for the ion beam producing system. The set point is fed to closed loop HD controller 860. Controller 860 interprets the set point signal, reads the temperature output of thermocouple 850 and controls the on and off stages of relay 865 in manner to apply appropriate electric power from power source 875 to heater 830 to achieve the desired temperature at thermocouple 850.

As with the other embodiments described below, this heating arrangement is capable of maintaining the extraction electrode at a well-controlled, elevated temperature sufficiently high to prevent condensation of decaborane or octadecaborane vapor emanating from the relatively cool-operating ion source of FIGS. 7 and 7A, to be described. The extraction electrode, made of fluorine-resistant materials, enables periodic in situ cleaning of the electrode to remove any deposits, employing fluorine vapors drawn through the extraction aperture of the associated ion source 400. Such cleaning systems will now be described.

Reactive Gas Cleaning

FIG. 1 shows the reactive gas source 455 at terminal potential, with reactive gas inlet 430 incorporating a high voltage break 431, which can be fabricated of an insulating ceramic such as $Al_2O_3$, for example. Since ion sources for ion implantation can in general be biased up to a maximum voltage of about 90 kV, this high voltage break 431 must stand off 90 kV for that application. As will be described below, the cleaning system is used only with the ionizing source and high voltages off (de-energized), so that there is only high voltage across break 431 when the vacuum housing 410 is under high vacuum, which makes high voltage standoff clearance requirements easier to meet. A dedicated endpoint detector 470, in communication with the vacuum housing 410, is used to monitor the reactive gas products during chemical cleaning.

For ion sources suitable for use with ion implantation systems, e.g. for doping semiconductor wafers, the ionization chamber is small, having a volume less than about 100 ml, has an internal surface area of less than about 200 cm$^2$, and is constructed to receive a flow of the reactive gas, e.g. atomic fluorine or a reactive fluorine-containing compound at a flow rate of less than about 200 Standard Liters Per Minute.

It is seen that the system of FIG. 1 enables in situ cleaning, i.e. without the ion source and extraction electrode being removed from operating position in the vacuum housing, and with little interruption of service.

Figure 2:
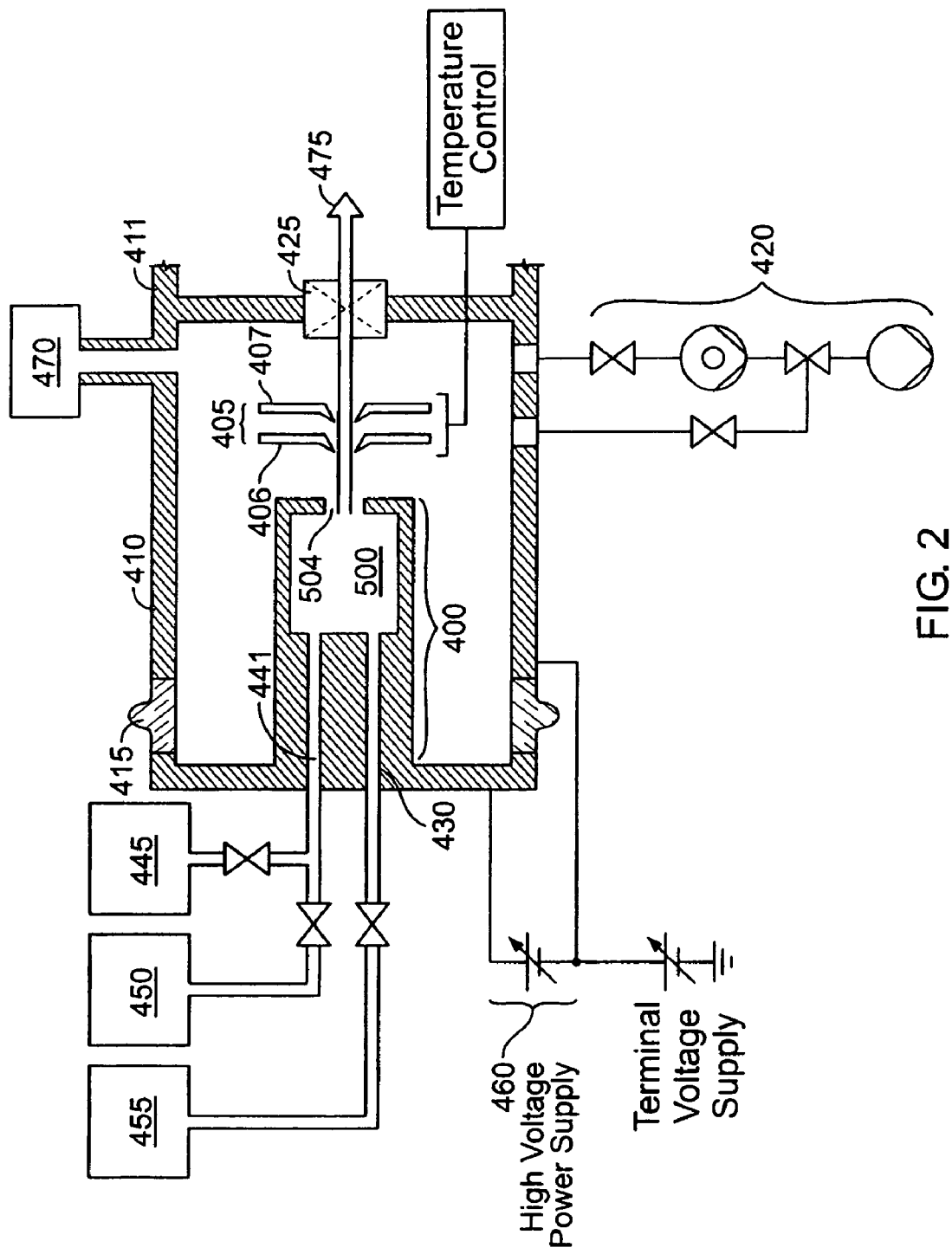
FIG. 2: Second embodiment of ion beam generation system incorporating reactive gas cleaning.

FIG. 2 illustrates another embodiment. The principal difference in FIG. 2 over FIG. 1 is that the reactive gas source 455 and reactive gas inlet 430 are at ion source potential. The benefits of this approach are twofold: it is a more compact arrangement, and it allows the reactive gas source 455 and its associated gas supplies to be contained in the gas box which, at ion source potential, supplies gas and power to the ion source 400, as is typical in commercial ion implantation systems.

Chemical Cleaning System

Figure 3:
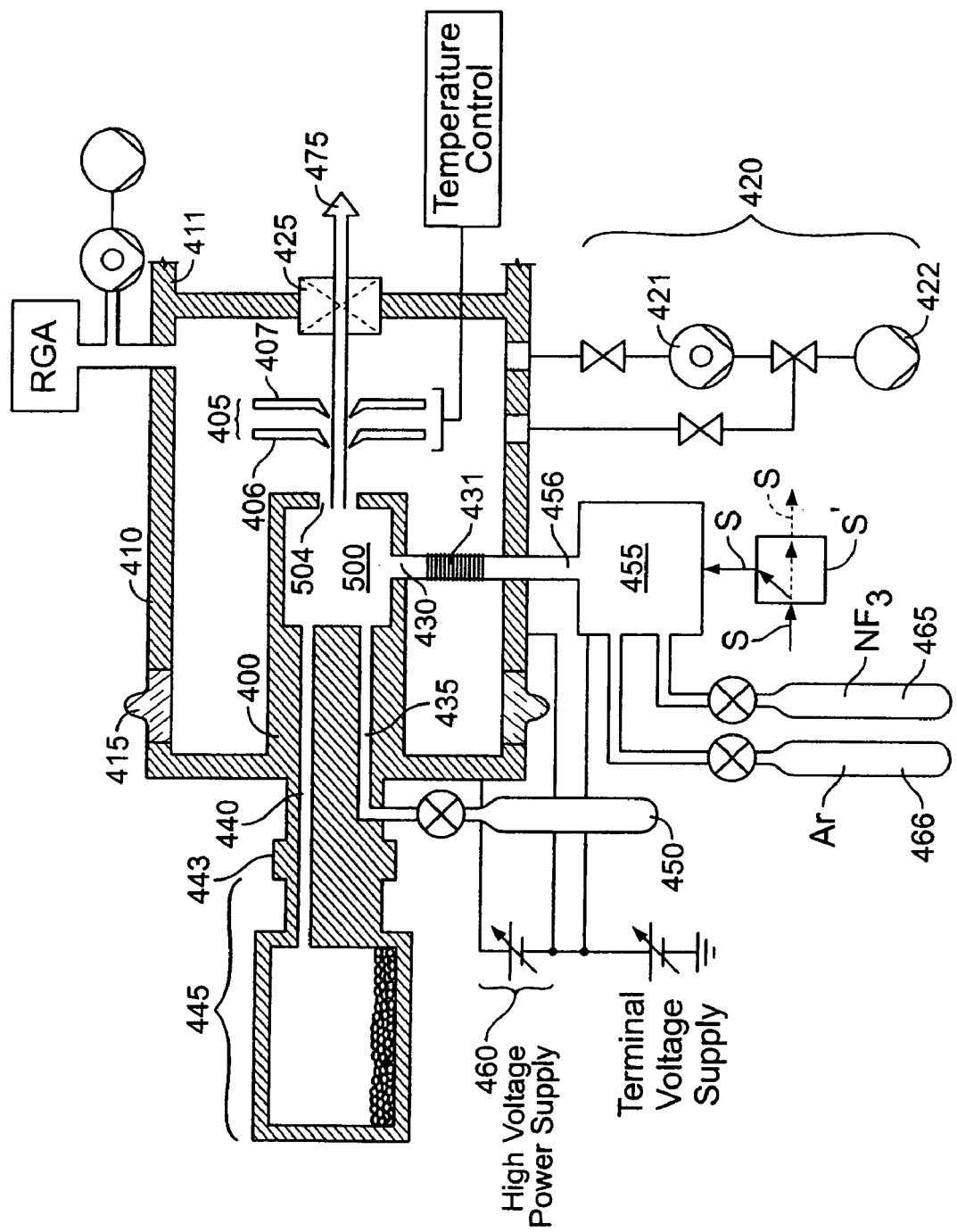
FIG. 3: Ion beam generation system similar to FIG. 1 but incorporating a vaporizer and certain gas distribution elements.

The embodiment of FIG. 3, having many features similar to FIG. 1, is constructed to generate, selectively, both cluster ions and monomer ions. It has a dedicated gas inlet 435 for feed material in normally gaseous state and is in communication, through valve 443, with a vapor source 445 for producing borohydride and other vaporized feed materials. For conducting in-situ chemical cleaning of the ion source and electrode, a remote plasma source 455 disassociates gas supplied by a cleaning gas supply 465, for example NF$_3$, into decomposition products such as F, F$_2$, and N-containing compounds. When cleaning is desired, after de-energizing the ion source, the decomposition products are fed into the ionization chamber from the outlet 456 of the remote plasma source 455 by dedicated reactive gas inlet 430. The remote plasma source 455 is mounted on the terminal potential side of voltage isolation bushing 415. Since the ion source 400 runs at high voltage, a high voltage break 431 in vacuum provides voltage isolation.

To initiate a cleaning cycle, the ion source is shut down and vacuum housing isolation valve 425 is closed; the high vacuum pump 421 of the vacuum pumping system 420 is isolated and the vacuum housing 410 is put into a rough vacuum state of <1 Torr by the introduction of dry N$_2$ gas while the housing is actively pumped by backing pump 422. Once under rough vacuum, argon gas (from Ar gas source 466) is introduced into the plasma source 455 and the plasma source is energized by on-board circuitry which couples radio-frequency (RF) power into the plasma source 455. Once a plasma discharge is initiated, Ar flow is reduced and the F-containing cleaning gas feed 465, e.g. NF$_3$, is introduced into plasma source 455. Reactive F gas, in neutral form, and other by-products of disassociated cleaning gas feed 465, are introduced through reactive gas inlet 430 into the de-energized ionization chamber 500 of ion source 400. The flow rates of Ar and NF$_3$ (for example) are high, between 0.1 SLM (Standard Liters per Minute) and a few SLM. Thus, up to about 1 SLM of reactive F as a dissociation product can be introduced into the ion source 400 in this way. Because of the small volume and surface area of ionization chamber 500, this results in very high etch rates for deposited materials. The ionization chamber 500 has a front plate facing the extraction electrode, containing the extraction aperture 504 of cross sectional area between about 0.2 cm$^2$ and 2 cm$^2$, through which, during energized operation, ions are extracted by extraction electrode 405. During cleaning, the reactive gas load is drawn from ionization chamber 500 through the aperture 504 by vacuum of housing 410; from housing 410 the gas load is pumped by roughing pump 422. Since the extraction electrode 405 (constructed, for instance, as electrode 805 of FIG. 1A) is near and faces aperture 504 of ionization chamber 500, the electrode surfaces intercept a considerable volume of the reactive gas flow. This results in an electrode cleaning action, removing deposits from the electrode surfaces, especially from the front surface of suppression electrode 406 (e.g. suppression electrode 810, FIG. 1A), which is in position to have received the largest deposits. Thus, it is beneficial to fabricate extraction electrode and its mounting of F-resistant materials, such as Al (either aluminum or aluminum alloy) and the insulator elements of Al$_2$O$_3$.

The embodiment of FIG. 3 also has an endpoint detector consisting of a differentially-pumped, Residual Gas Analyzer (RGA), constructed for corrosive service. Analyzer RGA is in communication with vacuum housing 410. It is to be used as a detector for the end point of the cleaning action by monitoring partial pressures of F-containing reaction products (for example, BF$_3$ gas resulting from B combining with F). Other types of endpoint detectors can be used, the RGA being shown to illustrate one particular embodiment. When the boron-containing partial pressures decline at RGA, the cleaning process is largely completed. Once the cleaning process is ended, the plasma source 455 is turned off and is briefly purged with Ar gas (which also purges the ionization chamber 500, the housing 410 and elements contained therein). The roughing pump 422 is then isolated from direct communication with vacuum housing 410, the high vacuum pump 421 isolation valve is opened, and vacuum housing 410 is restored to high vacuum (about $1 \times 10^{-5}$ Torr or below). Then, vacuum housing isolation valve 425 is opened. The system is now ready to resume ion beam generation. The ion source voltage supply 460 can be energized and ion source 400 operated normally.

Figure 16:
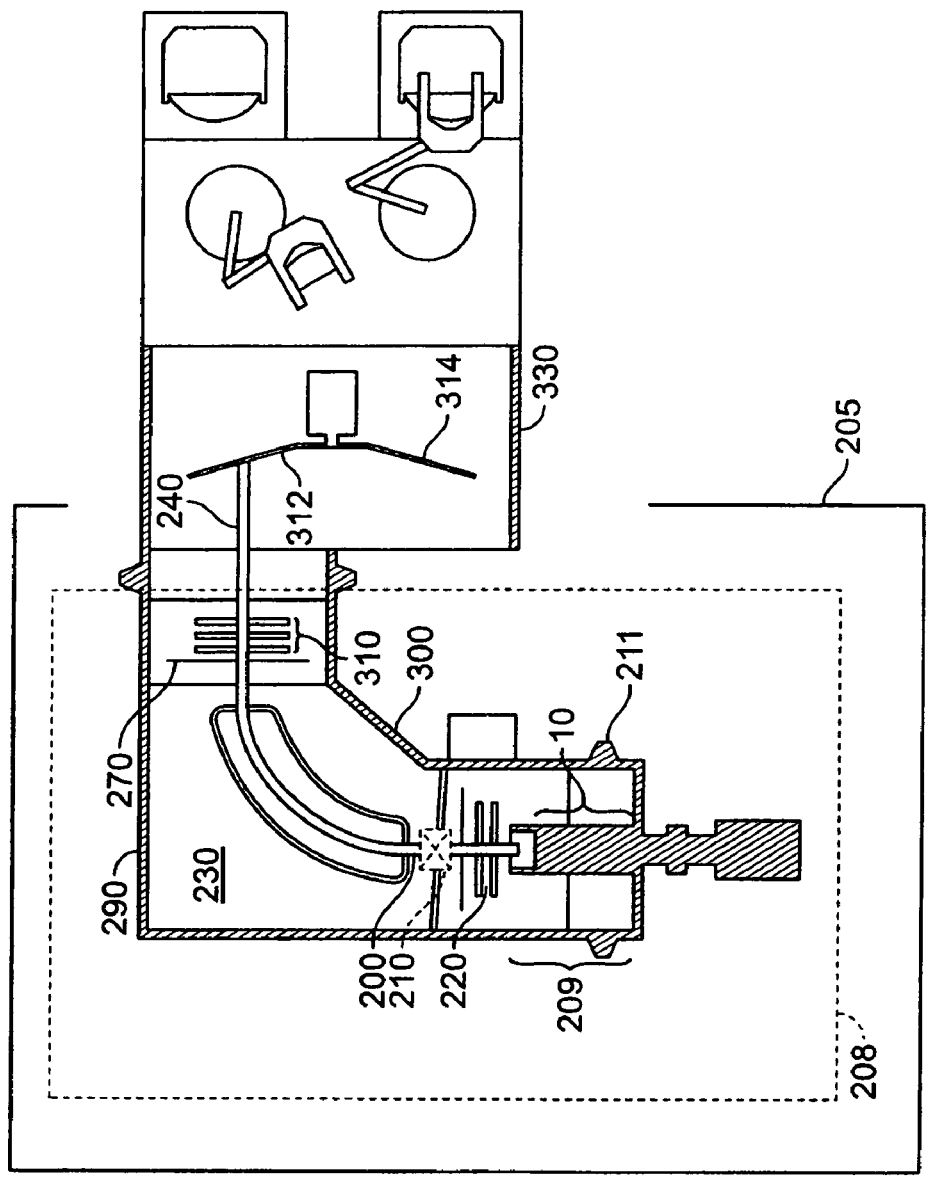
FIG. 16: Ion implanter.

An advantage of the embodiment of FIG. 3 is that the service facilities needed to support the remote plasma source 455, such as cooling water circulation and electrical power, can be at the terminal potential of an ion implanter (see 208 in FIG. 16). This enables sharing facilities denoted at S such as cooling water and electrical power, with the mass-analyzer magnet 230 of the implanter. During cleaning mode, when plasma source 455 is energized, the analyzer 230 is de-energized and therefore does not need water or power, and vise versa, during ion beam production mode. This "sharing" can be accomplished by suitable control arrangements represented diagrammatically at S', which direct service facilities such as cooling water circulation and power supply connection alternatively to the analyzer magnet 230, dashed arrow S, or to the remote plasma source 455, solid arrow S, depending upon the mode of operation being employed.

Figure 4:
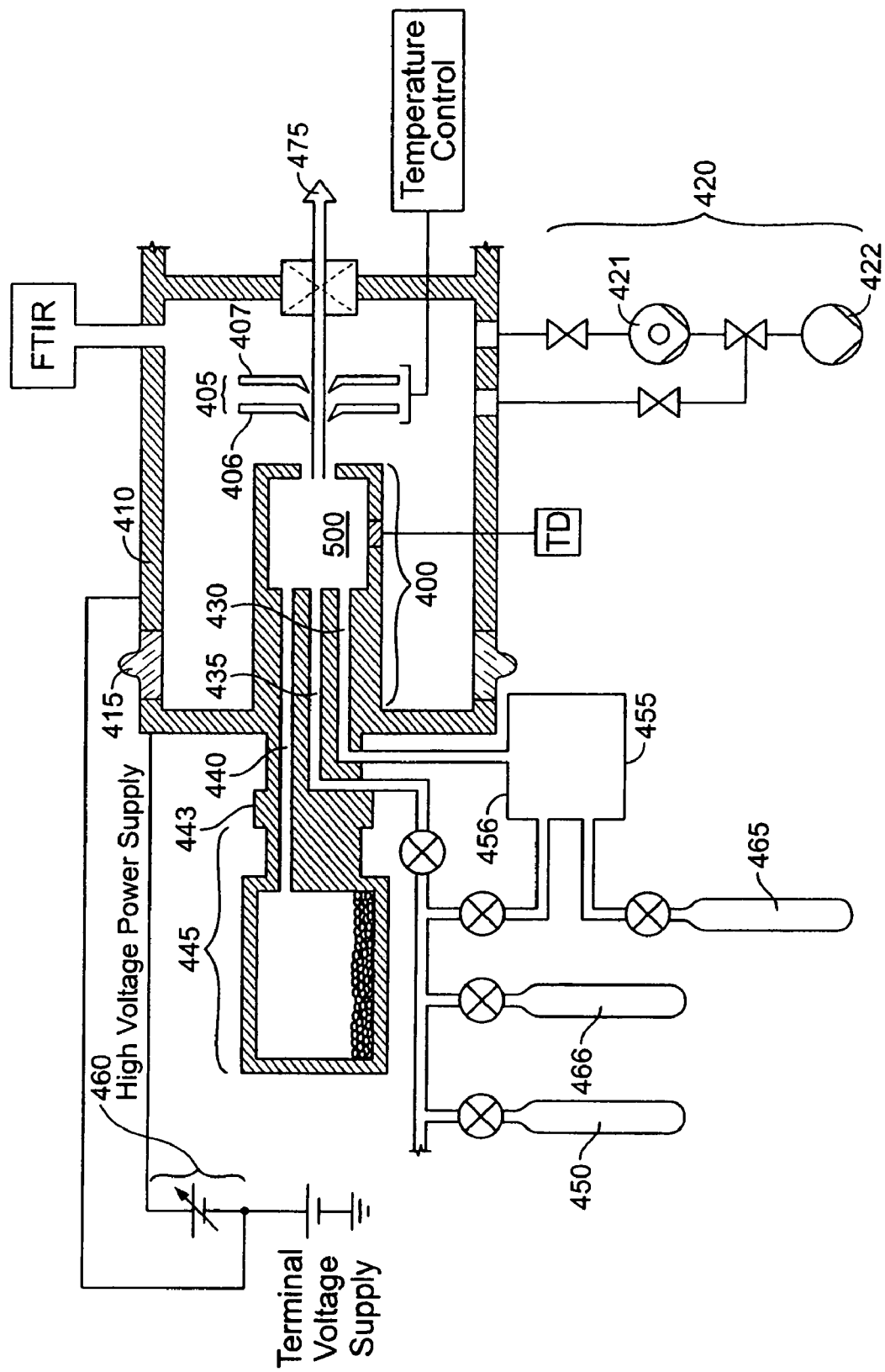
FIG. 4: Ion beam generation system similar to FIG. 2 but incorporating a vaporizer and certain gas distribution elements.

FIG. 4 shows an implementation similar to FIG. 2 for conducting in-situ chemical cleaning of an source 400 and extraction electrode 405. Three inlet passages are integrated into ion source 400, respectively for reactive gas 430 from plasma source 455, feed gas 435 from one of a number of storage volumes 450 selected, and feed vapor 440 from vaporizer 445. Unlike FIG. 3, the embodiment of FIG. 4 has the plasma-based reactive gas source 455 at the high voltage of ion source 400. This enables the remote plasma source 455 to share control points of the ion source 400, and also enables the cleaning feed gas 465 and argon purge gas from storage 466 to be supplied from the ion source gas distribution box, which is at source potential, see also FIGS. 6 and 6A. Also shown is a different type of endpoint detector, namely a Fourier Transform Infrared (FTIR) optical spectrometer. This detector can function ex-situ (outside of the vacuum housing), through a quartz window. Instead, as shown in FIG. 4, an extractive type of FTIR spectrometer may be used, which directly samples the gas in the vacuum housing 410 during cleaning. Also a temperature sensor TD may sense the temperature of the de-energized ionization chamber by sensing a thermally isolated, representative region of the surface of the chamber. The sensor TD can monitor heat produced by the exothermic reaction of F with the contaminating deposit, to serve as an end-point detection.

Figure 5:
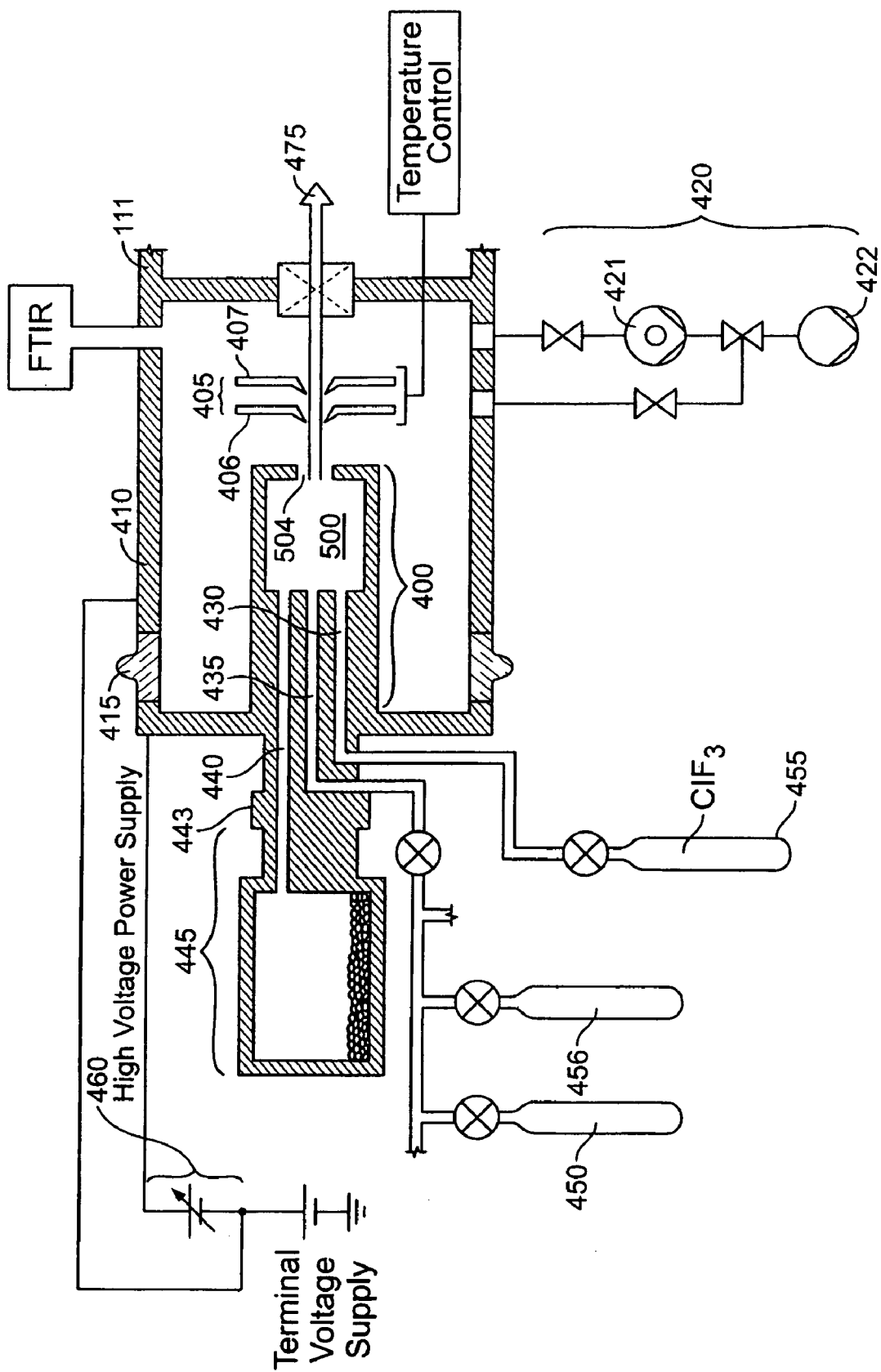
FIG. 5: Ion generation system incorporating reactive gas cleaning by the introduction of $ClF_3$.

FIG. 5 shows an ion beam-generating system similar to that of FIG. 4, but incorporating a fundamentally different type of reactive gas source 455. In this case, reactive $ClF_3$ gas contained in a gas cylinder is fed directly into ion source 400 without use of a remote plasma source. This potentially reduces equipment cost and footprint since power and controls for a remote plasma source are not required. However, since $ClF_3$ is pyrophoric, it is dangerous and requires special gas handling, whereas $NF_3$ (for example) is primarily an asphyxiant, and is less toxic than many semiconductor gases, such as $BF_3$, $PH_3$, or $AsH_3$, and therefore safer.

Figure 6:
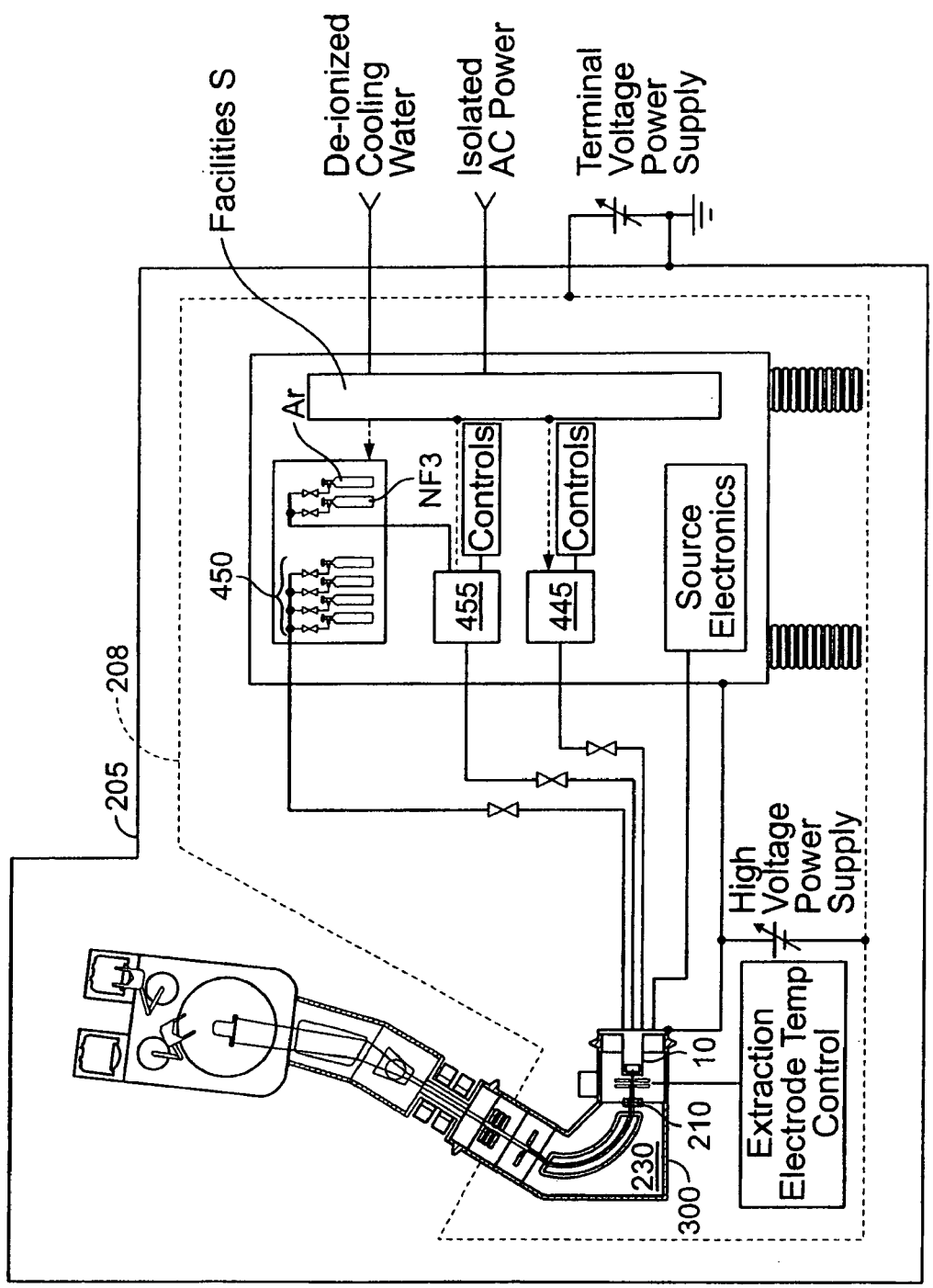
FIG. 6: Gas box for an ion implanter which includes a reactive gas plasma source, feed vapor source, ion source electronics, and facilities for the plasma source.

FIG. 6 shows plasma source 455, vapor source 445, source electronics, and service facilities S for the plasma source contained within a gas box B meant for retrofit into an existing ion implanter installation.

Figure 6A:
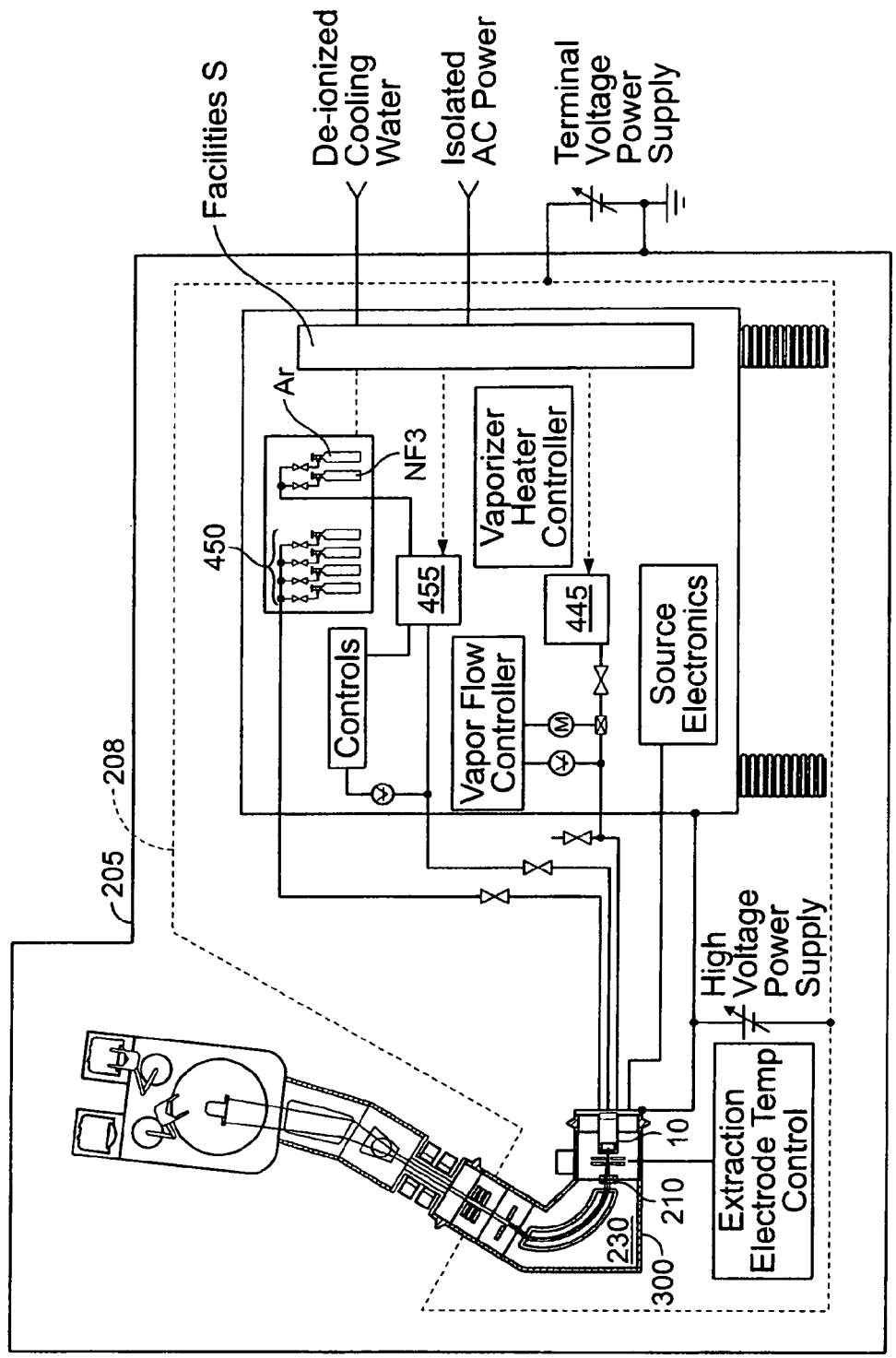
FIG. 6A: View similar to FIG. 6, showing a vapor flow control system.
Figure 6B:
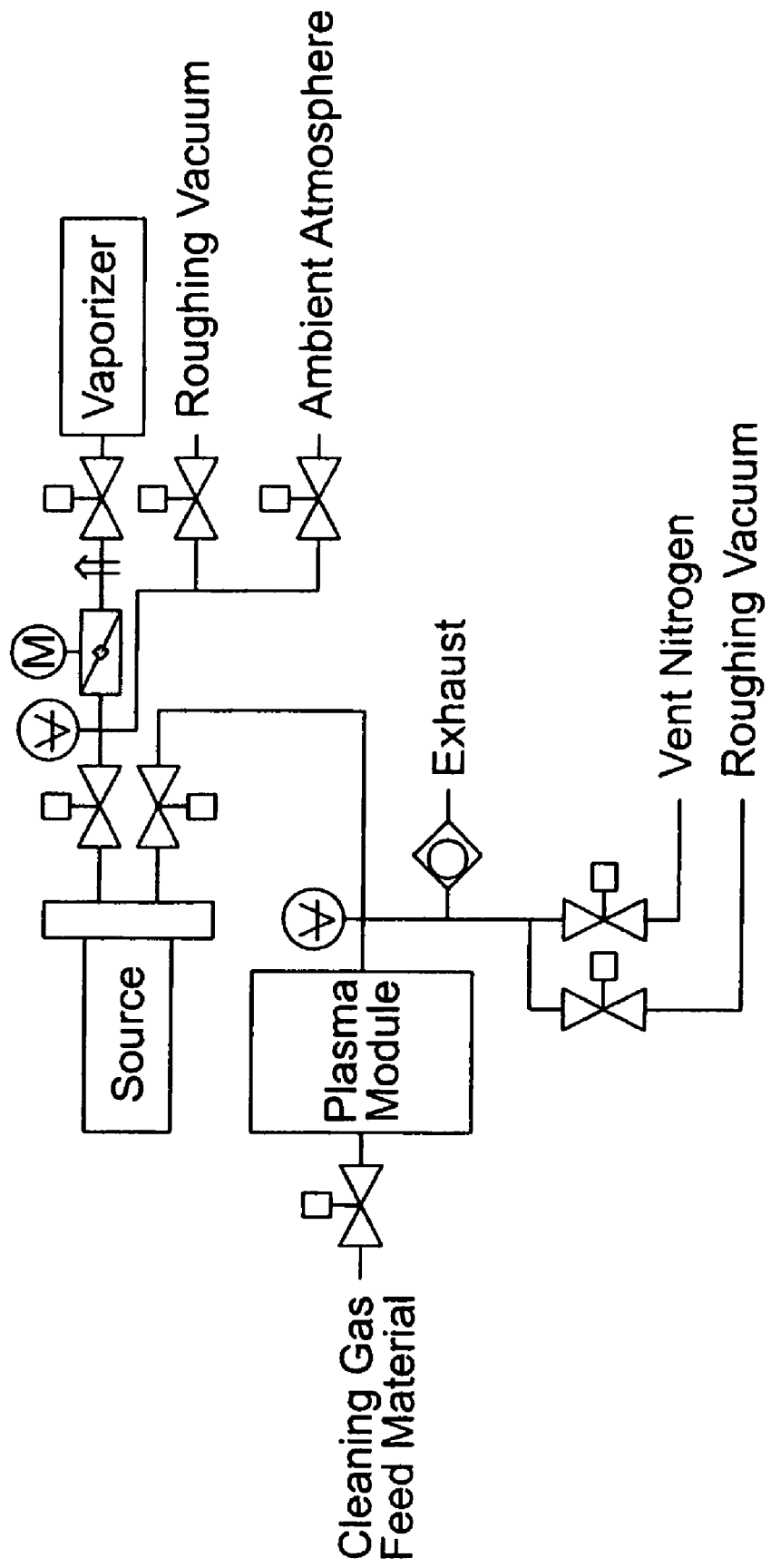
FIG. 6B: Valve schematic for an ion beam generating system.

The embodiment of FIG. 6a differs from the embodiment of FIG. 6 above, by incorporating a preferred vaporizer and flow control system described below. FIG. 6B is a valve schematic diagram for the ion source and self-cleaning system of FIG. 4.

Preferred Ion Source and Vaporizer

Figure 7:
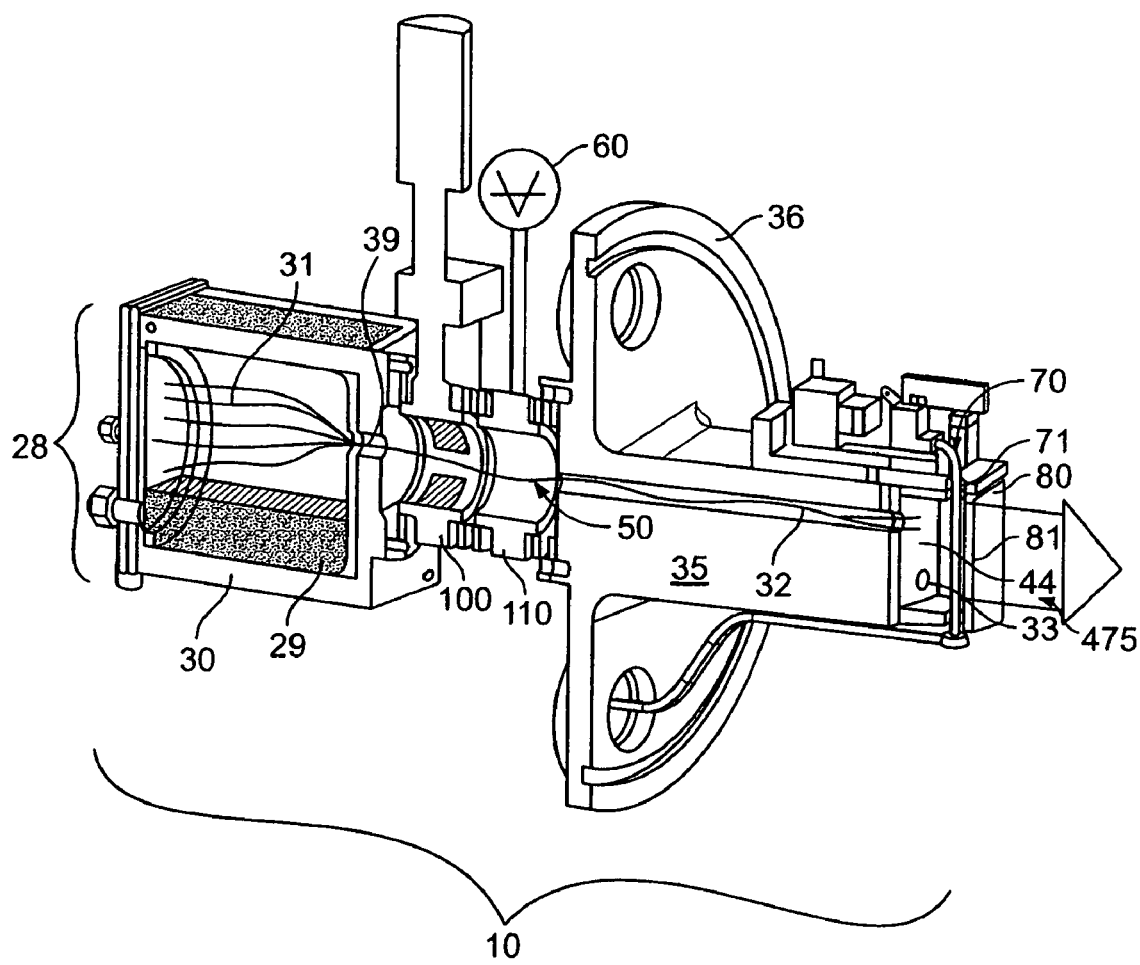
FIG. 7: Electron-impact ion source.
Figure 7A:
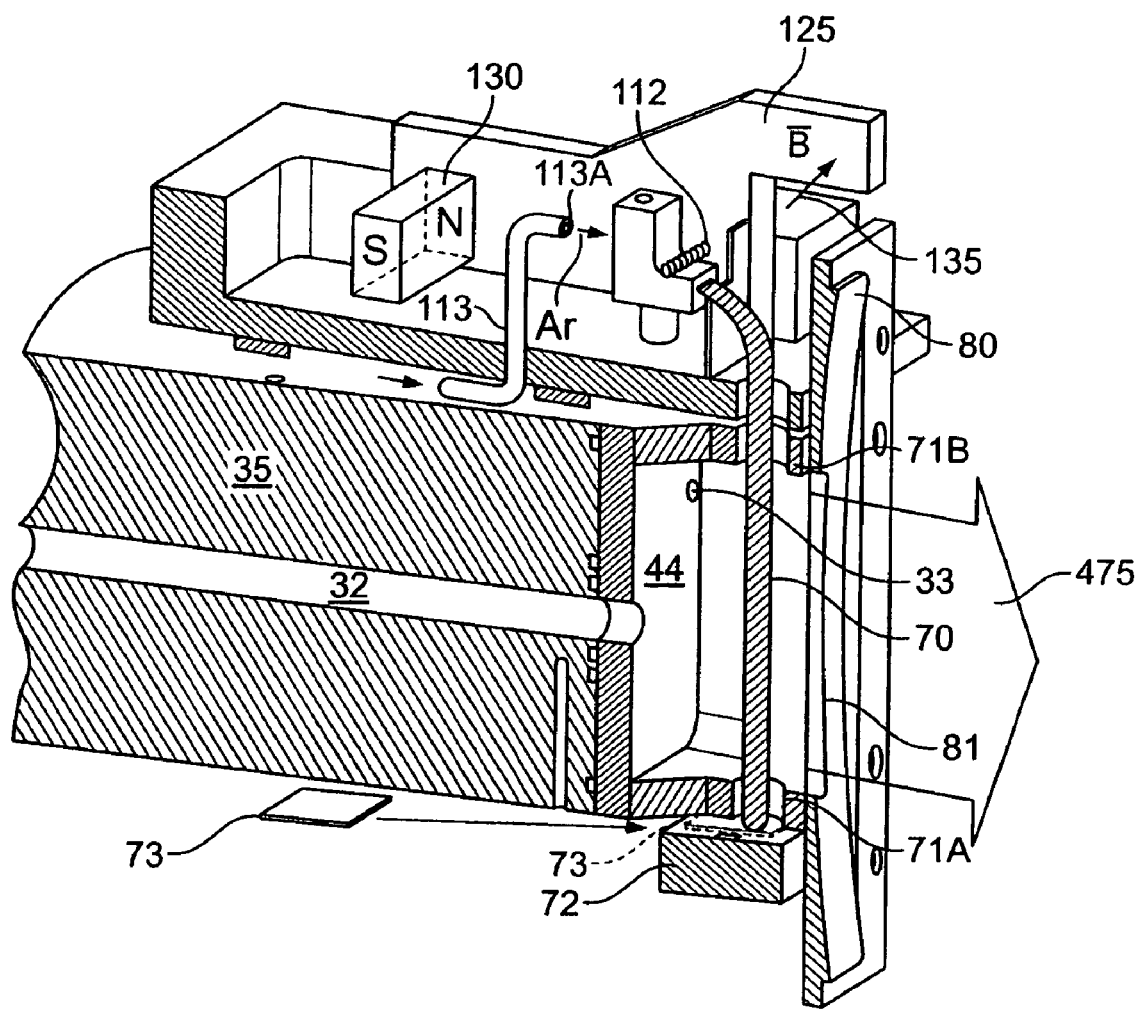
FIG. 7A: Magnified view of a portion of FIG. 7, showing shielding of elements.

FIG. 7 is a diagram of a preferred ion source 10 and its various components, and see FIG. 7A. The details of its construction, as well as its preferred modes of operation, are similar to that disclosed by Horsky et al., International Application No. PCT/US03/20197, filed Jun. 26, 2003: "An ion implantation device and a method of semiconductor manufacturing by the implantation of boron hydride cluster ions", and by Horsky, U.S. patent application Ser. No. 10/183,768, "Electron impact ion source", filed Jun. 26, 2002, both herein incorporated by reference. The ion source 10 is one embodiment of a novel electron impact ionization system. FIG. 7 is a cross-sectional schematic diagram of the source construction which serves to clarify the functionality of the components which make up the ion source 10. The ion source 10 is made to interface to an evacuated vacuum chamber of an ion implanter by way of a mounting flange 36. Thus, the portion of the ion source 10 to the right of flange 36, shown in FIG. 7, is at high vacuum (pressure $<1 \times 10^4$ Torr). Gaseous material is introduced into ionization chamber 44 in which the gas molecules are ionized by electron impact from electron beam 70, which enters the ionization chamber 44 through electron entrance aperture 71 such that electron beam 70' is aligned with (i.e. extends adjacent, parallel to) ion extraction aperture 81. Thus, ions are created adjacent to the ion extraction aperture 81, which appears as a slot in the ion extraction aperture plate 80. The ions are then extracted and formed into an energetic ion beam 475 by an extraction electrode 220 (FIGS. 8 and 9) located in front of the ion extraction aperture plate 80. Referring to FIG. 7, gases such as argon, phosphine, or arsine, for example, may be fed into the ionization chamber 44 via a gas conduit 33. Solid feed materials 29 such as decaborane or octadecaborane can be vaporized in vaporizer 28, and the vapor fed into the ionization chamber 44 through vapor conduit 32 within the source block 35. Typically, ionization chamber 44, ion extraction aperture plate 80, source block 35 (including vapor conduit 32), and vaporizer housing 30 are all fabricated of aluminum. Solid feed material 29 is held at a uniform temperature by closed-loop temperature control of the vaporizer housing 30. Sublimated vapor 50 which accumulates in a ballast volume 31 feeds through conduit 39 and through throttling valve 100 and shutoff valve 110. The nominal pressure of vapor 50 between throttling valve 100 and shutoff valve 110 is monitored by heated pressure gauge 60, preferably a capacitance manometer. Since the vapor 50 feeds into the ionization chamber 44 through the vapor conduit 32, located in the source block 35, and gases feed in through gas conduit 33, both gaseous and vaporized materials may be ionized by this ion source, which is capable of creating ion beam 475 consisting of either molecular ions (such as $B_{18}H_x^+$) or monomer ions (such as $As^+$), as needed. The ion source may instead be a multi-mode ion source such as described in U.S. Pat. No. 7,022,999, issued Apr. 4, 2006, Entitled "Ion Implantation Ion Source, System and Method", or as described in U.S. patent application Ser. No. 11/268,005, filed Nov. 7, 2005, entitled "Dual Mode ion Source for Ion Implantation and Forming N-Type Regions with Phosphorus and Arsenic Ions", the contents of each of which, to the extent describing multi-mode ion sources, being hereby incorporated by reference in their entireties.

Vapor Flow Control into the Ion Generating System

Figure 7B:
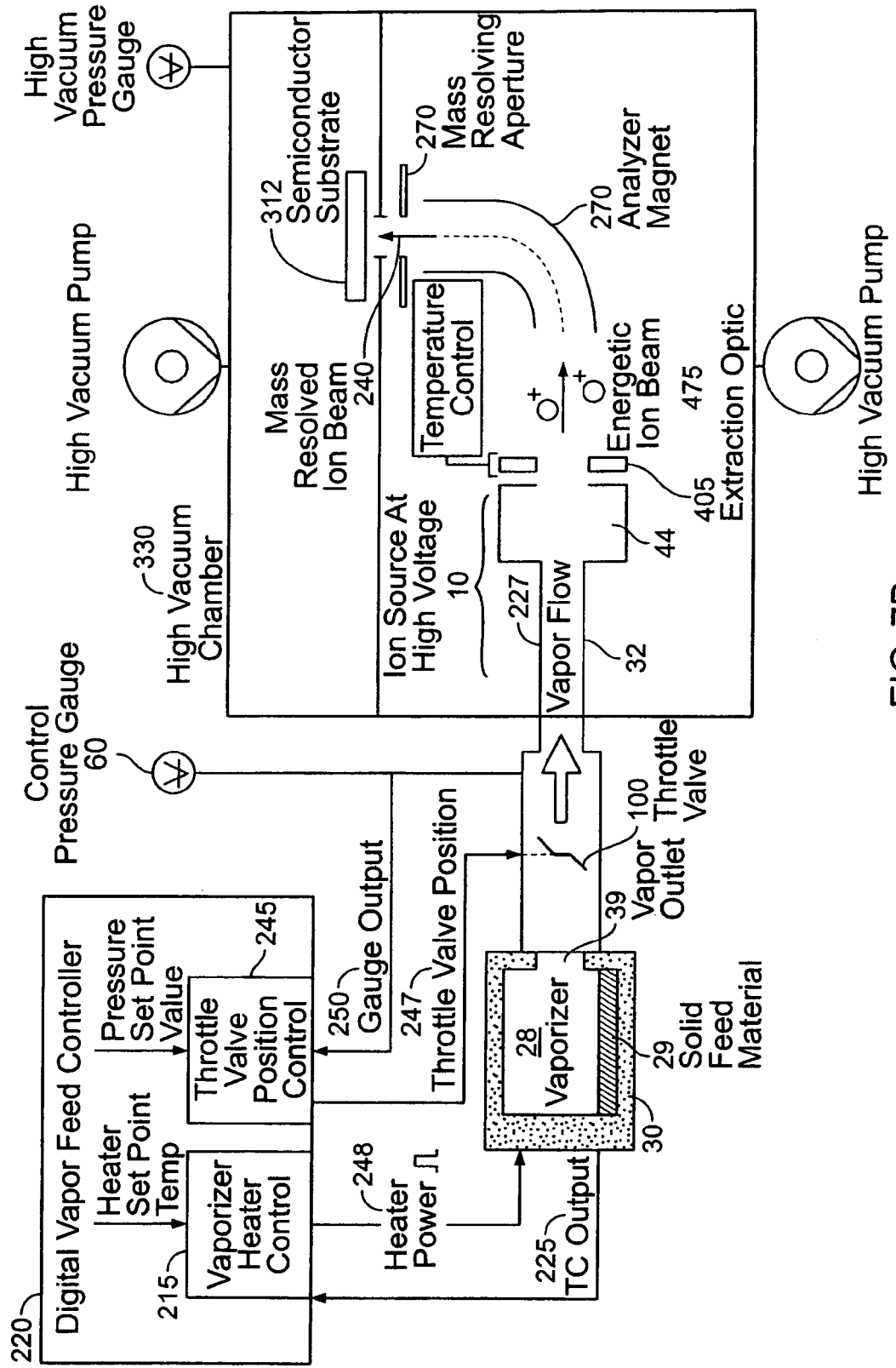
FIG. 7B: Control diagram for an embodiment.

The flow of vapor to ionization chamber of FIG. 7, and see FIG. 7B, is determined by the vapor pressure in the region just before vapor feed passage 32, i.e., within shutoff valve 110 in FIG. 7. This is measured by pressure gauge 60, e.g. a capacitance monometer, located between throttling valve 100 and shut-off valve 110. In general, the flow rate is proportional to the vapor pressure. This allows the pressure signal to represent flow, and to be used as a set point to select flow. To generate a desired vapor flow into the ion source, vaporizer housing 30 is brought to a temperature such that when throttling valve 100 is in its fully open position, the desired flow rate is exceeded. Then the throttling valve 100 is adjusted to reach the desired pressure output.

To establish a stable flow over time, separate closed loop control of the vaporizer temperature and vapor pressure is implemented using dual PID controllers, such as the Omron E5CK control loop digital controller. The control (feedback) variables are thermocouple output for temperature, and gauge output for pressure. The diagram of FIG. 7B shows a digital vapor feed controller 220 for performing these closed loop control functions.

In FIG. 7B gauge output 250 from pressure gauge 60 is applied to throttle valve position control 245 which applies throttle valve position control signal 247 to throttle valve 100. Thermocouple output 225 from vaporizer 28 is applied to vaporizer heater control 215 which controls heater power 248 applied to the vaporizer 28.

A second, slow level of control is implemented by digital feed controller 220, accommodating the rate at which solid feed material vaporizes being a function of its open surface area, particularly the available surface area at the solid-vacuum interface. As feed material within the vaporizer is consumed over time, this available surface area steadily decreases until the evolution rate of vapors cannot support the desired vapor flow rate, resulting in a decrease in the vapor pressure upstream of the throttle valve 100. This is known as "evolution rate limited" operation. So, with a fresh charge of feed material in the vaporizer, a vaporizer temperature of, say, 25 C might support the required vapor flow at a nominal throttle valve position at the low end of its dynamic range (i.e., the throttling valve only partially open). Over time (for example, after 20% of the feed material is consumed), the valve position would open further and further to maintain the desired flow. When the throttle valve is near the high conductance limit of its dynamic range (i.e., mostly open), this valve position is sensed by the controller 220, which sends a new, higher heater set point temperature to the vaporizer heater control 215. The increment is selected to restore, once the vaporizer temperature settles to its new value, the nominal throttle valve operating point near the low end of its dynamic range. Thus, the ability of the digital controller 220 to accommodate both short-timescale changes in set point vapor pressure and long-timescale changes in vaporizer temperature makes the control of vapor flow over the lifetime of the feed material charge very robust. Such control prevents over-feeding of vapor to the ionization chamber. This has the effect of limiting the amount of unwanted deposits on surfaces of the ion generating system, thus extending the ion source life between cleanings.

Figure 8:
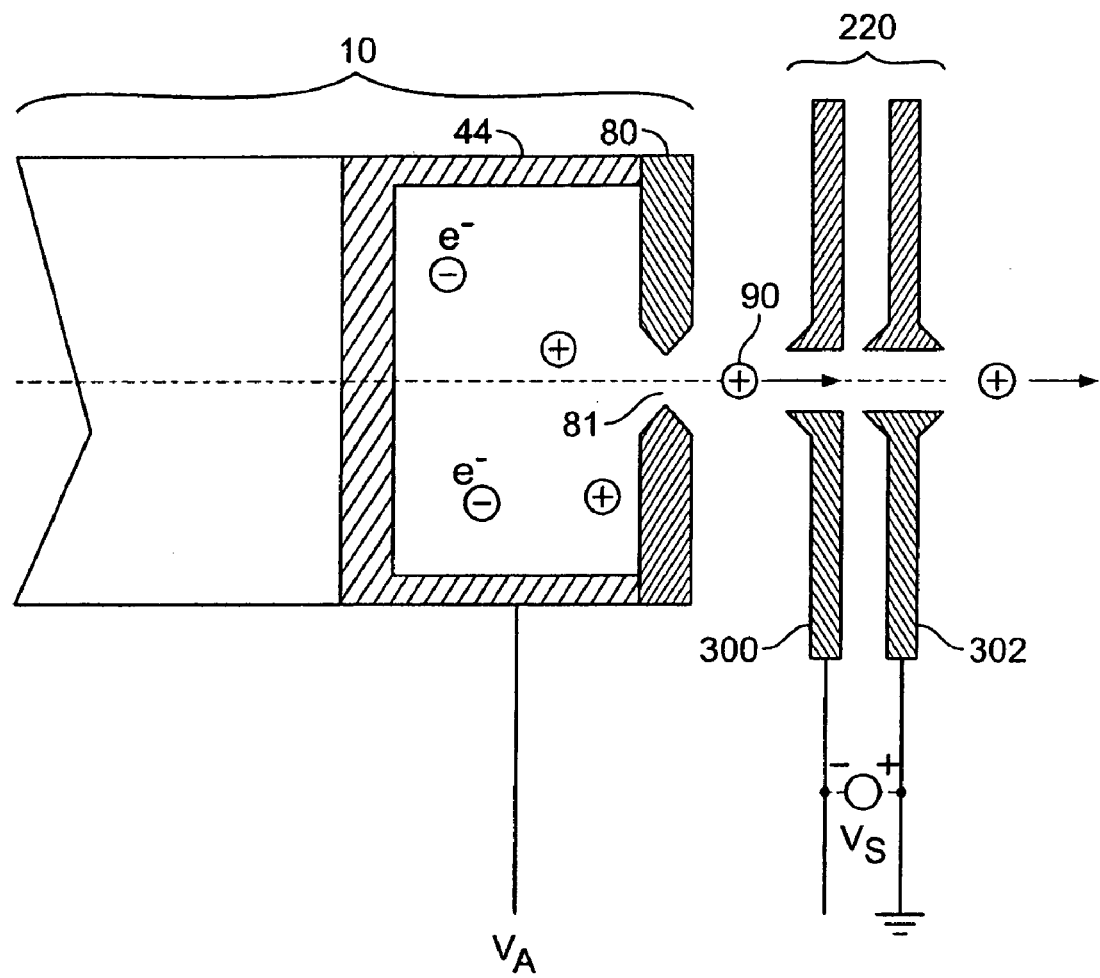
FIG. 8: Ion extraction electrode.

FIG. 8 shows a top view (looking down) of an ion extraction electrode 220 facing the novel ion source 10. The ion source 10 is held at a positive potential $V_A$ with respect to the ion extraction electrode 220, which is at local ground potential, i.e., at the potential of the vacuum housing. The ion extraction electrode 220 is a simple diode; electrode plate 302 is the "ground" electrode and plate 300 the "suppression" electrode, typically held a few thousand volts below ground potential by suppression power supply $V_S$. The ionization chamber 44 and ion extraction aperture plate 80 of ion source 10 are shown facing extraction electrode 220. The three plates 80, 300, 302 contain rectangular slots or apertures through which ions 90 are extracted; FIG. 8 illustrates the slot profiles in the "short", or dispersive, direction.

Further Embodiments of Novel Heated Electrode

Figure 9:
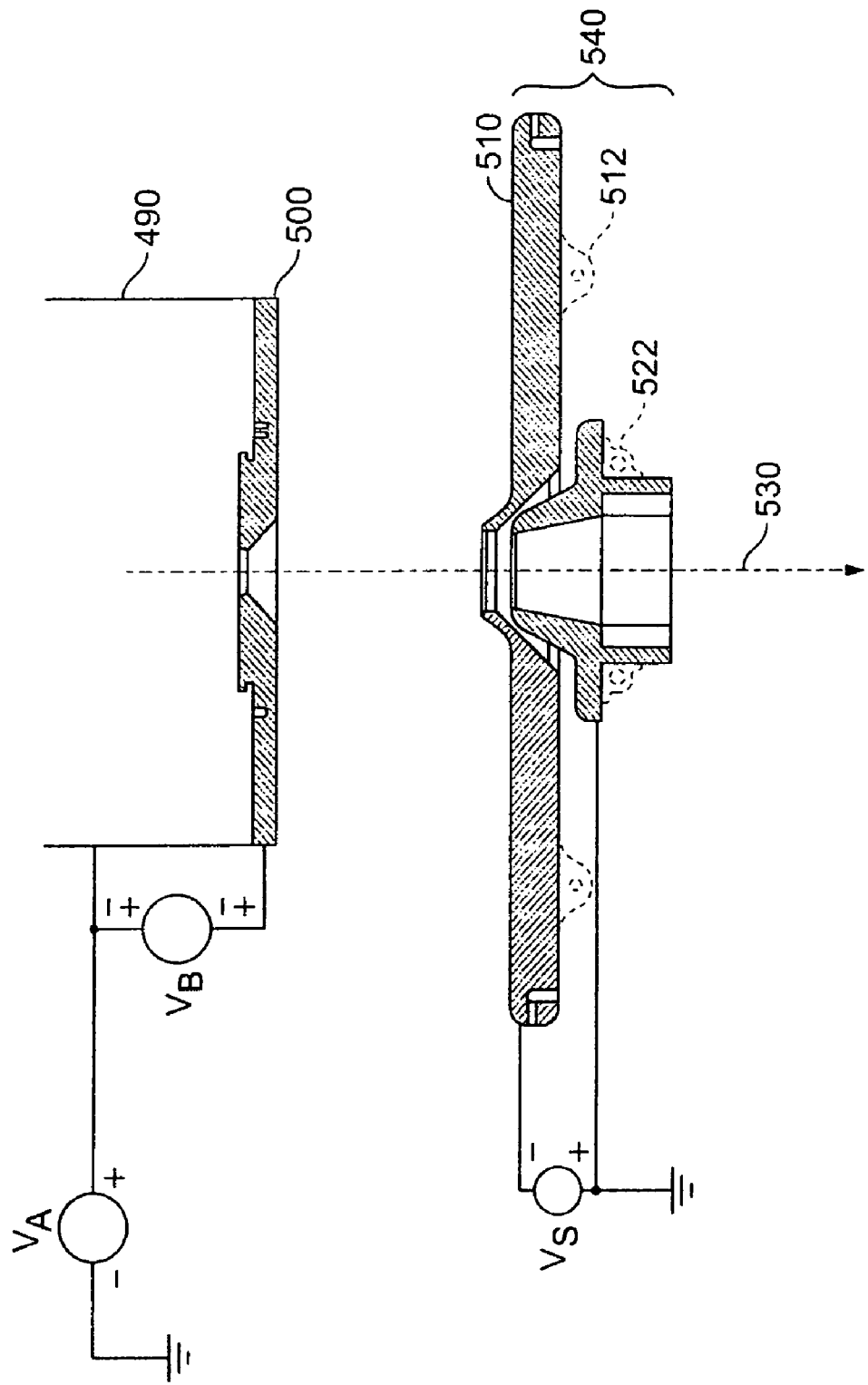
FIG. 9: Ion extraction electrode optics.
Figure 14:
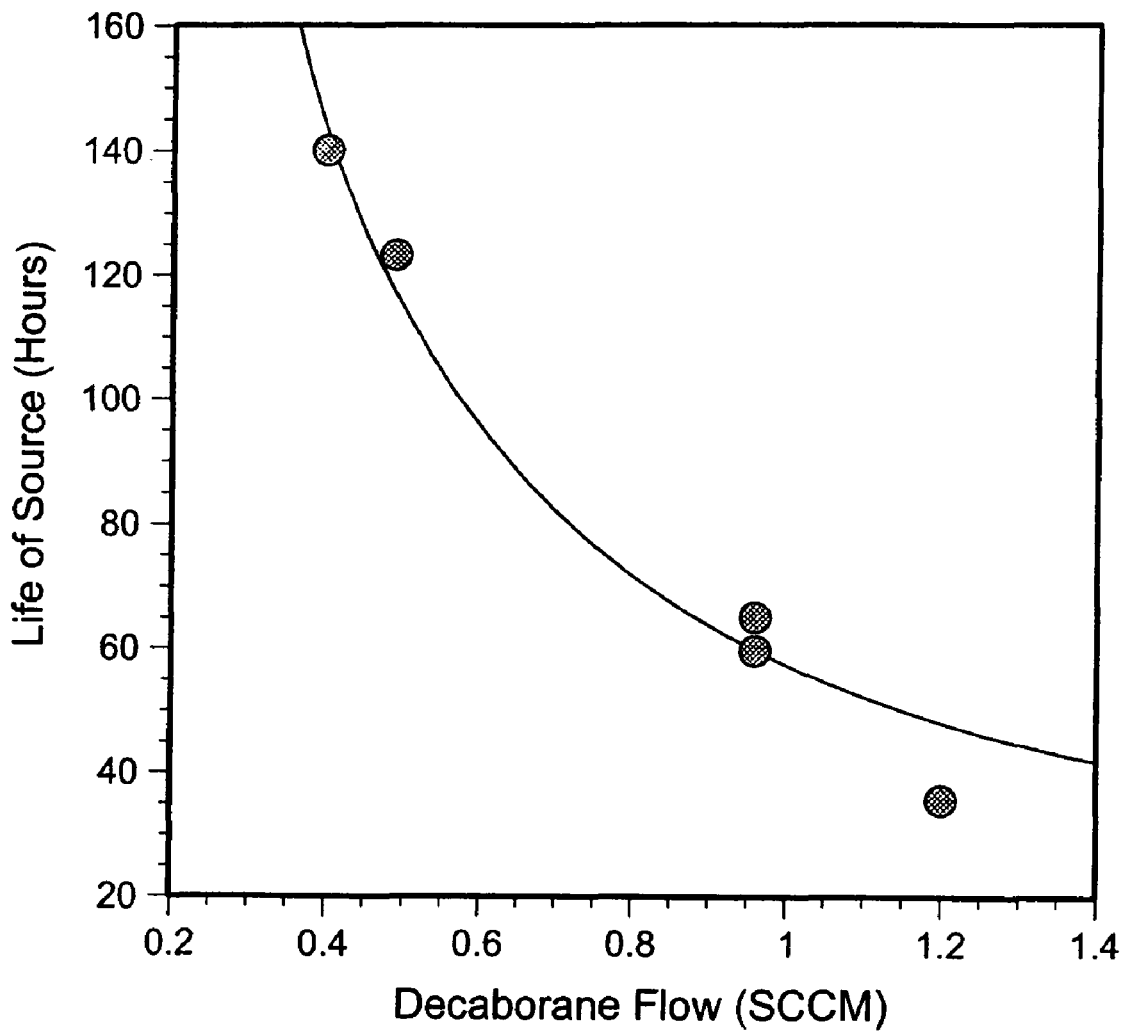
FIG. 14: Lifetime versus decaborane vapor flow rate.

During the decaborane lifetime tests shown in FIG. 14, a novel heated aluminum electrode was used. FIG. 9 shows a top view of the basic optical design of the extraction system, in the dispersive plane of the one-dimensional "slot" aperture lenses. In the implanter used, the ionization chamber 490 of the ion source was held at the desired ion beam energy by positive high voltage power supply $V_A$, FIG. 8. For example, if a 20 keV ion beam is desired, then $V_A$=20 kV. Ion extraction aperture plate 500 is electrically isolated from ionization chamber 490 such that it can be biased by bipolar power supply $V_B$ from −750V-750V. The isolation is accomplished by a thermally conductive, electrically insulating polymeric gasket which is sandwiched between the ion extraction aperture plate 500 and ionization chamber 490. The parts of the ion source body that are exposed to vapor (source block 35, ionization chamber 44, and extraction aperture plate 80 in FIG. 7) are maintained in good thermal contact with each other to maintain controlled temperature surfaces during source operation. Ions produced in ionization chamber 490 are extracted through the aperture in ion extraction aperture plate 500 by extraction electrode 540 consisting of suppression electrode 510 and ground electrode 520. The ions propagate as a focused ion beam along the beam axis 530. Suppression electrode 510, biased to a few thousand volts negative by power supply $V_S$, serves to suppress secondary electrons which are generated downstream from the suppression electrode due to beam strike, preventing these energetic electrons from back streaming into the positively-biased ion source. The ionization chamber 490, ion extraction aperture plate 500, suppression electrode 510, and ground electrode 520 are all fabricated of aluminum, and have smooth, carefully polished surfaces to minimize local electric fields.

Figure 9A:
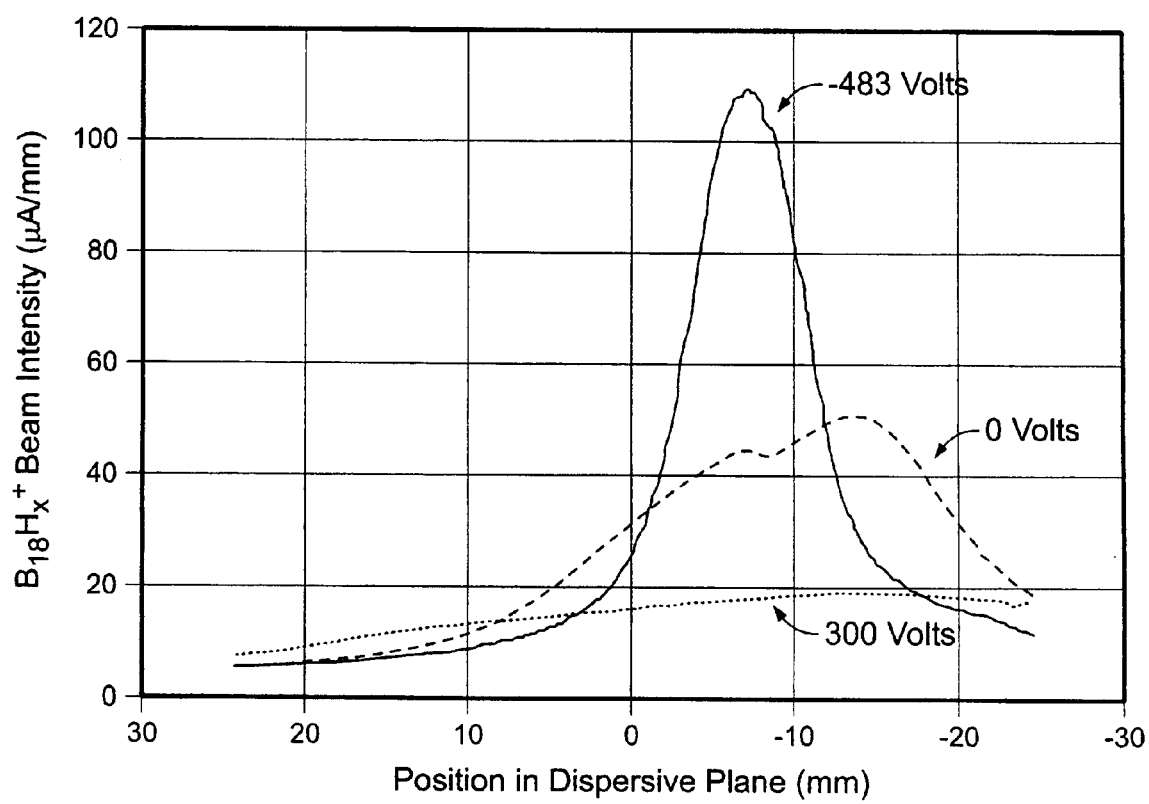
FIG. 9A: $B_{18}H_x^+$ beam profiles.

An important effect of biasing ion extraction aperture plate 500 is to change the focal length of the ion optical system of FIG. 9. A negative bias increases the focal length, while a positive bias decreases the focal length. For large biases, the effect can be substantial. For diagnostic purposes, a scanning-wire profilometer was installed, located at the entrance to the analyzer magnet, just downstream of the source housing isolation valve (210 in FIG. 16). This scanner recorded the beam current distribution in the dispersive plane, useful to determine how well the ion beam is being focused in the dispersive plane. 20 keV octadecaborane beam profiles are shown in FIG. 9a for three different biasing conditions: −483V, 0, and +300V. The zero volt condition is substantially over focused, the positive voltage condition more over focused, and the negative voltage condition properly focused. The electrode position was held constant during the three measurements. As expected, the proper focusing condition yielded the highest ion beam currents.

The ability to change the optical focal length, and thus tune the optical system to obtain the highest ion beam current, enables introduction of the least amount of feed material to the vaporizer. Again, this has the beneficial effect of limiting the amount of unwanted deposits on surfaces of the ion generating system, extending the ion source life between cleanings.

Figure 10:
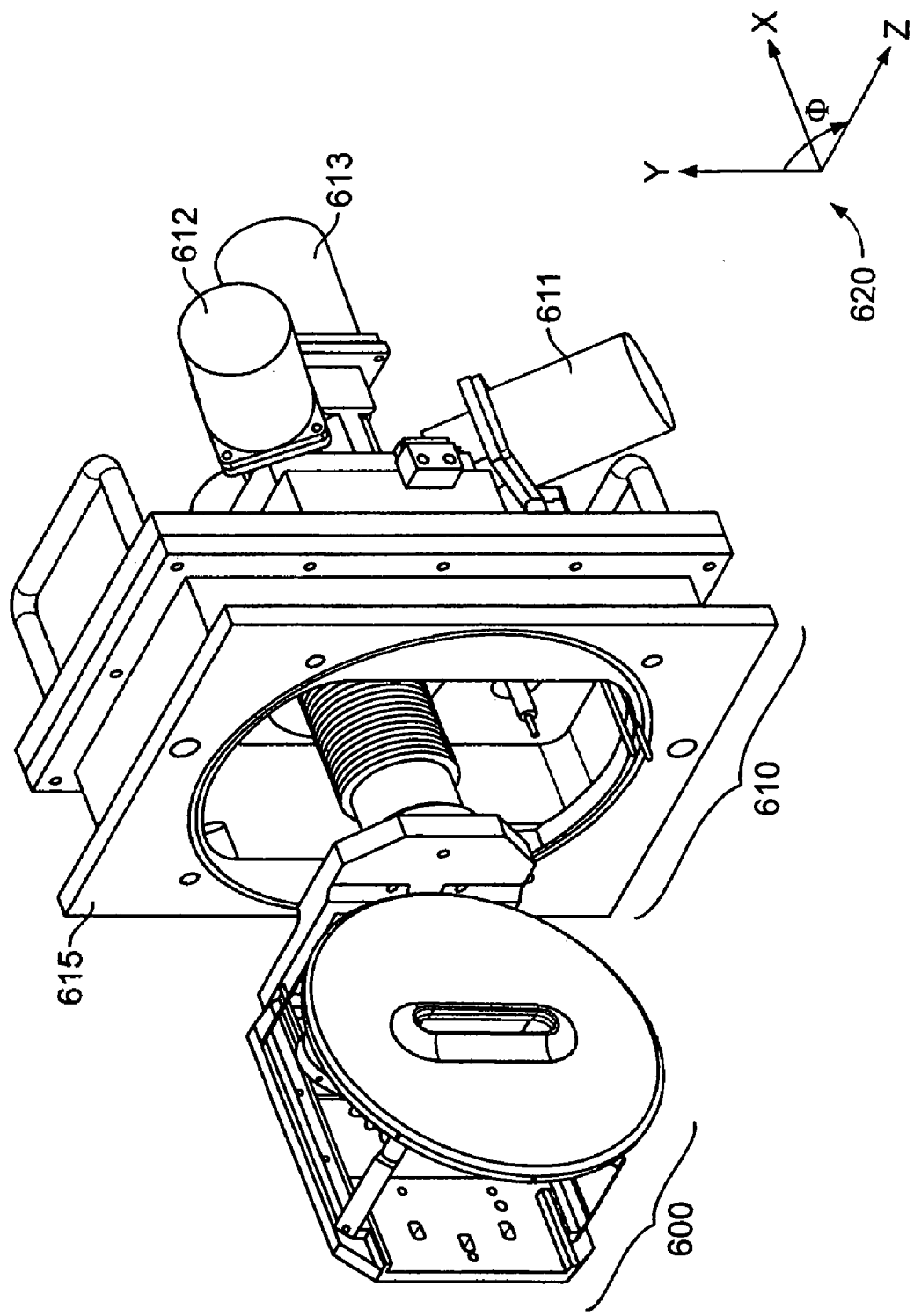
FIG. 10: Extraction electrode and manipulator.

Besides the biasing of the extraction aperture plate for focusing the system just described, the invention provides means for moving the extraction electrode optic element relative to other components of the system. FIG. 10 shows the novel electrode 600 mounted on a three-axis manipulator 610 which allows for motion (with respect to the ion source) in X, Z and Θ, as defined by coordinate system 620. Actuator 613 controls X-motion, actuator 612 controls Z-motion, and actuator 611 controls Θ-motion. The manipulator 610 mounts to the side of the implanter vacuum housing via mounting flange 615.

Figure 11:
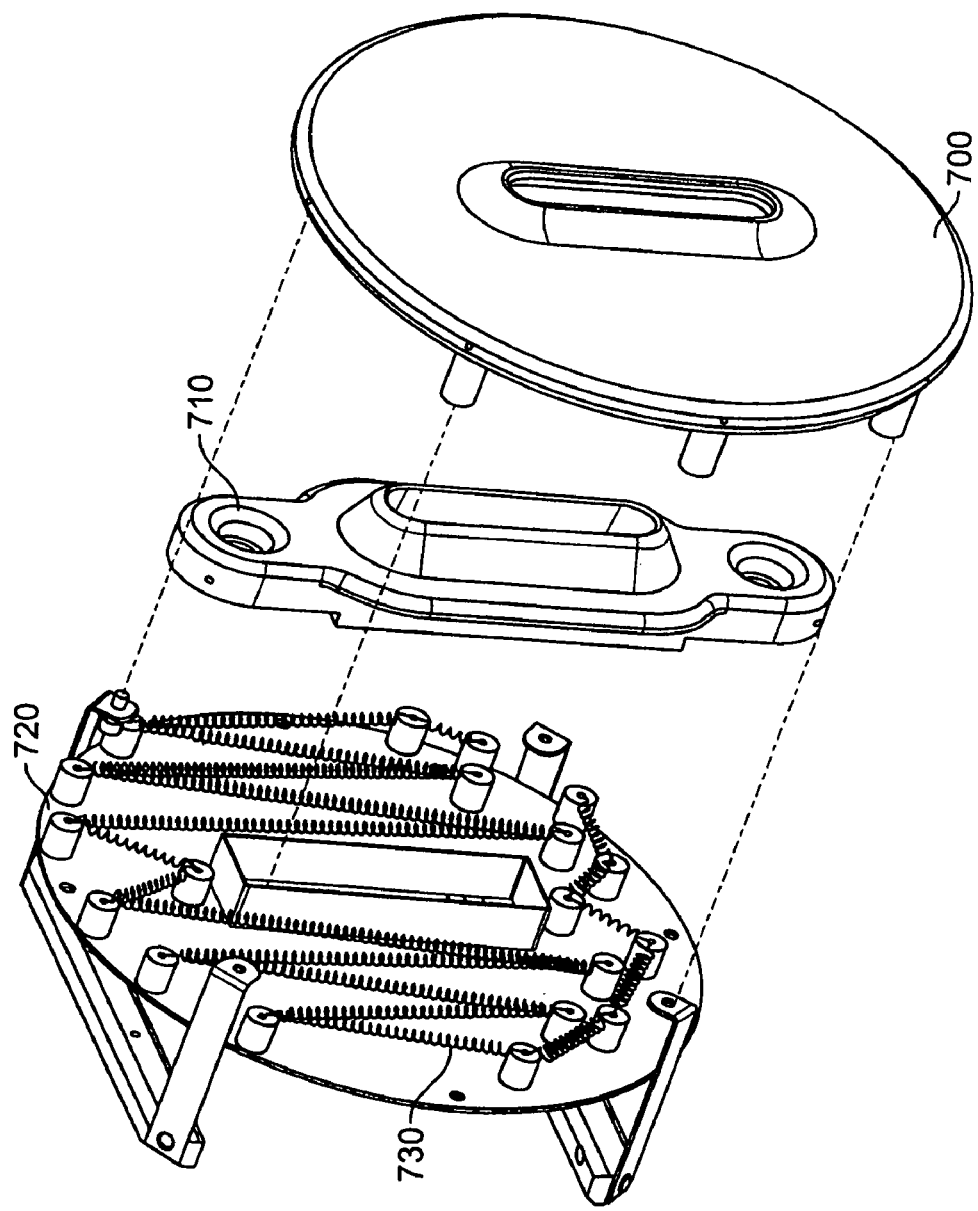
FIG. 11: Electrode head-exploded view.

FIG. 11 shows a partial exploded view of the radioactively-heated version of the novel electrode head. Shown are suppression electrode 700, ground electrode 710, heater plate 720, and radiant heater wire 730. The suppression and ground electrodes are fabricated of aluminum, the heater plate of stainless steel, and the heater wire 730 of nichrome. When the electrode was operated at 200 C, power consumption was about 60 W to maintain the temperature. The heater power is controlled with a closed-loop HD controller, the Omron E5CK, based on read back of a thermocouple.

Figure 12:
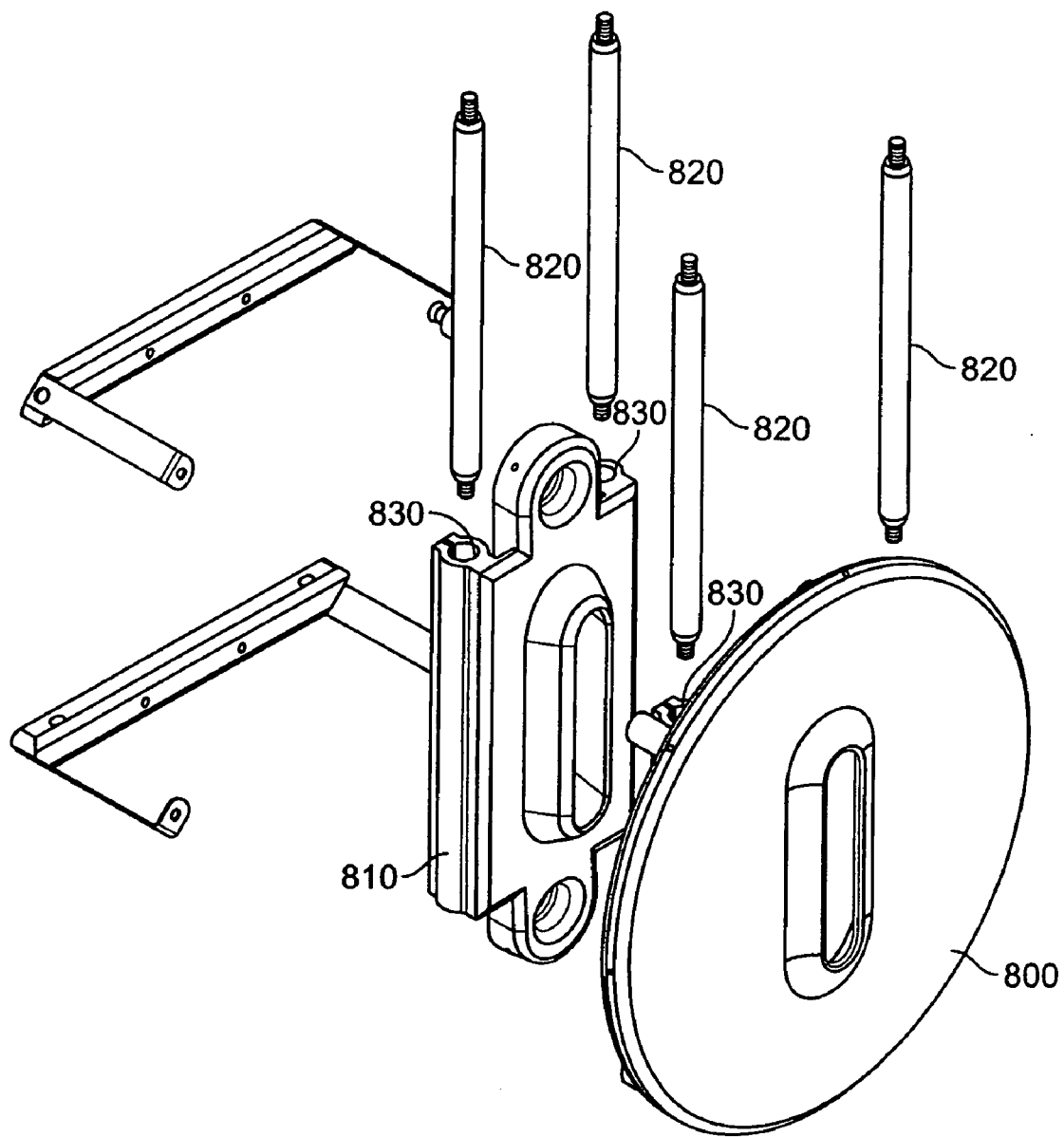
FIG. 12: Second embodiment of electrode head.
Figure 13:
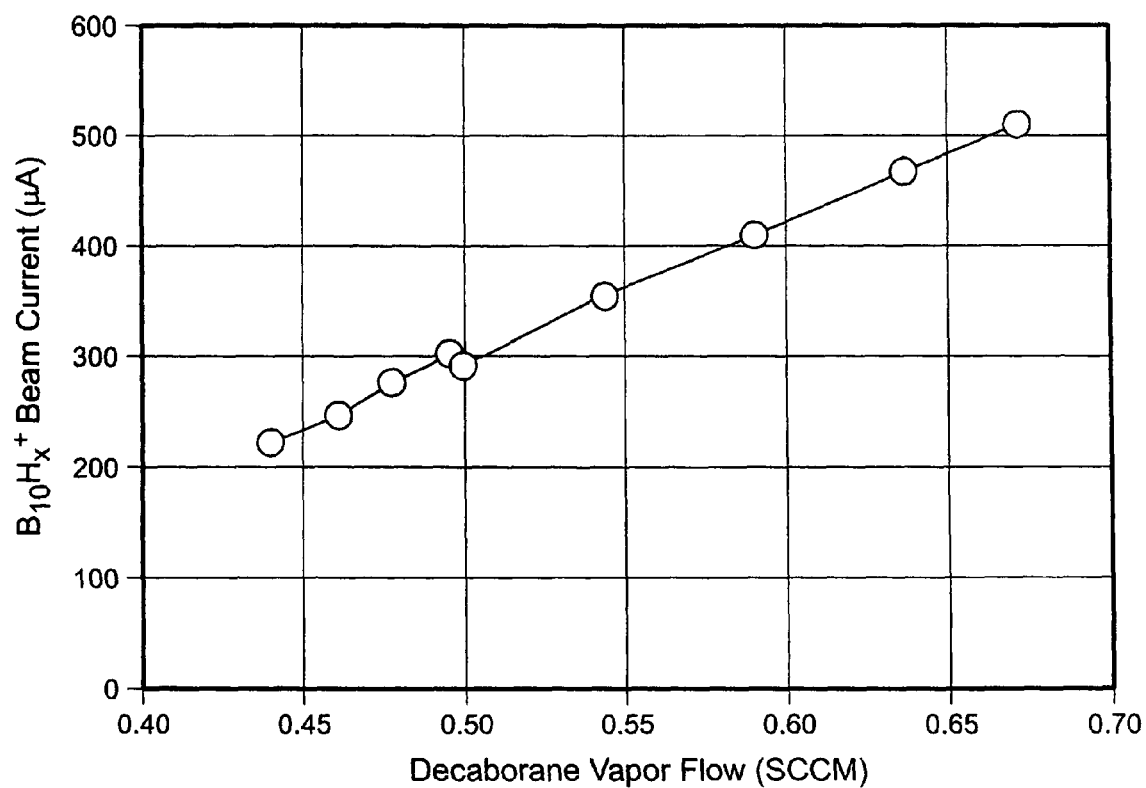
FIG. 13: $B_{10}H_x^+$ beam current versus decaborane flow rate.

FIG. 12 shows a partial exploded view of a resistively-heated version of the novel electrode head. Shown are suppression electrode 800, ground electrode 810, and resistive heaters 820. The four resistive heaters 820 fit into sleeves 830, two into each electrode plate. The sleeves 830 are a split design such that the heater press-fits into the sleeve, achieving intimate contact. Intimate contact between heater and electrode is important to insure proper heating of the electrode, and to prevent premature burnout of the heaters. Again, the Omron E5CK or equivalent can control the electrode temperature based on read back of a thermocouple.

As described above, use of these heating arrangements for the extraction electrode maintain a well-controlled, elevated temperature sufficiently high to prevent condensation of decaborane and octadecaborane such as produced by the relatively cool-operating ion source of FIGS. 7 and 7A. The extraction electrode made of fluorine-resistant materials, e.g. aluminum, enables periodic in situ cleaning of the electrode to remove any deposits by fluorine vapors drawn through the extraction aperture.

A different situation is encountered with plasma ion sources that inherently run so hot that the heat may harm the extraction electrode assembly if made of low temperature material. Referring to FIG. 9, shown in dotted lines are circular cooling coils, 512 and 522 secured in heat transfer relationship to the backs of aluminum electrode members 510 and 522, respectively. Circulation of cooling fluid through these cooling coils can cool the aluminum electrodes to prevent deformation by heat from hot ion sources. This enables use of fluorine-resistant materials for the extraction electrode, for instance aluminum or a complex containing aluminum, which provide resistance to attack by any fluorine present from feed materials or from reactive cleaning gas.

Figure 9B:
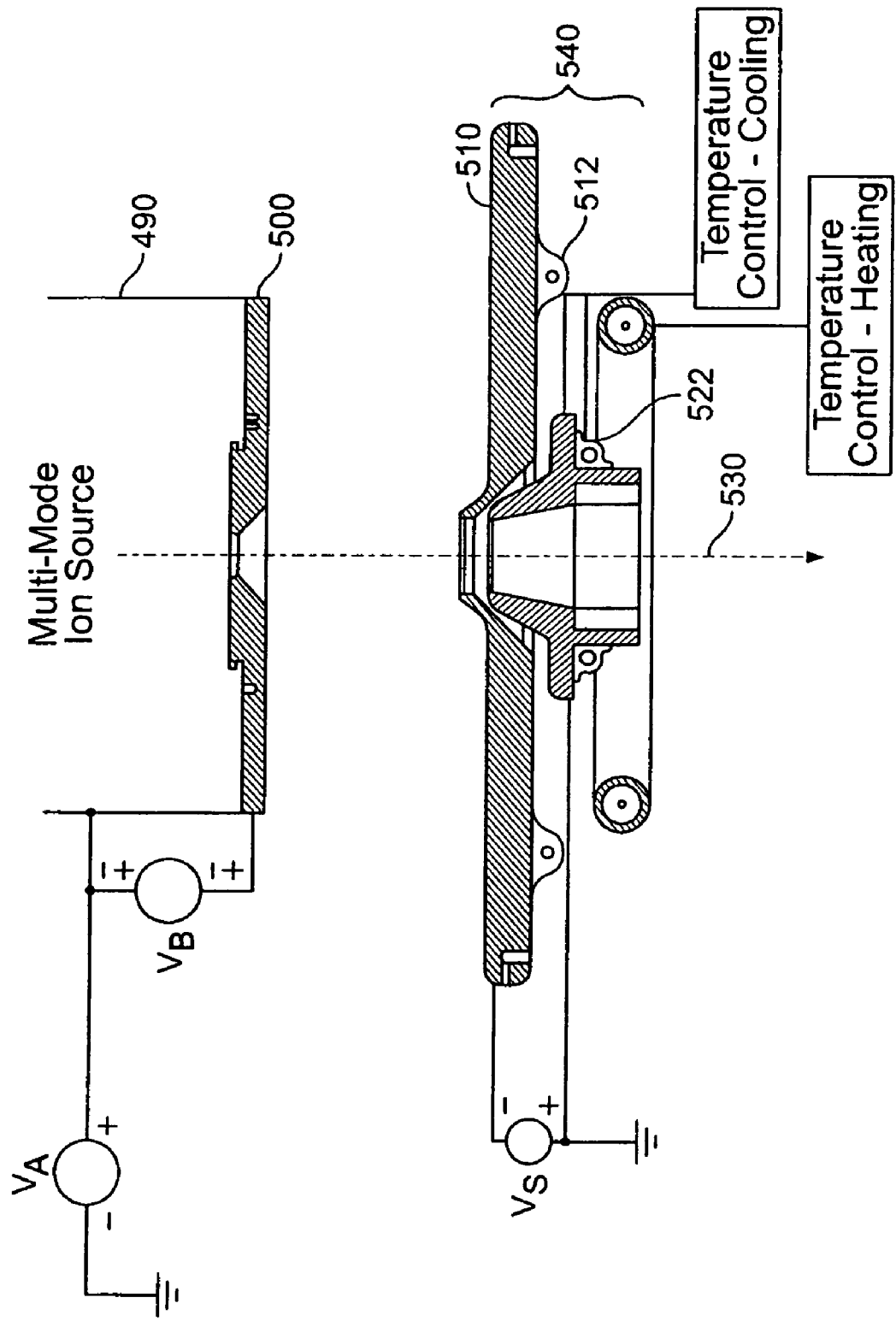
FIG. 9B: Extraction electrode having heating and cooling features and two electrode elements.

Referring to FIG. 9B, a temperature-controlled extraction electrode 540A is provided for use with a multimode ion source 490A capable of operating, alternatively, at cool and high temperature modes, or with replaceable units that operate at respective low and high temperature modes. The extraction electrode assembly 540A, formed for instance of aluminum, is equipped for active heating and cooling.

In cool ion source mode, useful with vapors of decaborane and octadecaborane, the extraction electrode is actively heated to deter formation of deposits on the electrode surfaces. The ion source may for instance operate by "soft" electron impact. In this case it employs a focused electron beam 70 as described above in relation to FIGS. 7 and 7A.

At the high temperature mode, the extraction electrode is actively cooled to enable it to be formed of relatively low temperature material such as aluminum. For a hot mode ion source, for instance, a hot plasma may be maintained by an arc-discharge within the ionization chamber, produced by an electron-emitting cathode and negatively biased electron repeller disposed within a confining magnetic field. Principles of design and construction of arc-discharge plasma ion sources, per se, are well known, see for instance Freeman, U.S. Pat. No. 4,017,403 and Robinson, U.S. Pat. No. 4,258,266, incorporated herein by reference in this respect. The arc discharge creates a relatively hot plasma which ionizes gas introduced to the ionization chamber. In both hot and cool-operating ion source modes the beam produced may be of ribbon shape, its elongated cross-section produced by the similarly elongated shape of the extraction aperture of the ion source and the aperture through the extraction electrode.

As shown in FIG. 9B, circular, radiant tube heater 550, such as the tubular heater described with reference to FIGS. 1A-1K, is arranged coaxially with the ribbon-shaped path 530 of ions from the ion source. Heater 550 is of diameter larger than the long dimension of the slot-form aperture through the electrode elements. The tubular heater is mounted downstream of the suppression electrode element in position to directly radiate heat to outer structure of both the extraction electrode element 520 at ground potential and the suppression electrode element 510 at relatively negative potential. The suppression electrode element is of the form described above, with an outer disc-shaped portion defining a broad, axially-directed face area adapted to receive and absorb heat radiating from the heater 550, and to conduct the heat radially to the inner portion of the electrode element. The ground electrode element is of smaller radial extent, and is constructed to be heated principally by heat radiating radially-inwardly from the surrounding heater.

By suitable temperature sensing, as by the thermocouple of FIG. 1L, a representative temperature of the extraction electrode assembly is detected. By use of a suitable controller, electric heating current flows through the internal resistive element of the tubular heater to maintain the temperature of the thermocouple at a set point. As with the controller shown in FIG. 1L, the set point is selected to prevent condensation of feed vapors that reach the extraction electrode. For instance, when ionizing decaborane and octadecaborane, the temperature of the extraction electrode may be maintained at about 150 C by active heating by the heater.

The extraction electrode assembly of FIG. 9B is also equipped with cooling coils, 512 and 522 that surrounds the beam path. The coils are secured in conductive heat transfer relationship to the backs of the aluminum electrode elements 510 and 522. As described regarding FIG. 9, circulation of cooling fluid through the cooling coils, cooling the aluminum electrode elements, can prevent electrode deformation by heat from a hot ion source, that otherwise might disturb the electric fields produced by the electrode elements.

When it is desired to employ the multimode ion source apparatus in a hot mode to produce ion beams of suitable species, the walls of the ionization chamber are permitted to operate at a substantially elevated temperature, e.g. above 400 C. In this mode of operation, heating of the extraction electrode assembly is disabled and a flow of cooling liquid is maintained in coils 512 and 522 to cool the aluminum electrode elements below a temperature at which detrimental distortion of the electrodes might occur, i.e. below about 400 C.

This electrode assembly combined with the multimode ion source is suitable for use in systems having in-situ reactive gas cleaning, described in relation to FIGS. 1 to 6B and 7B. The aluminum composition of the electrode elements and the corrosive-resistant sheath of the tubular heater are resistant to attack from fluorine.

Figure 9C:
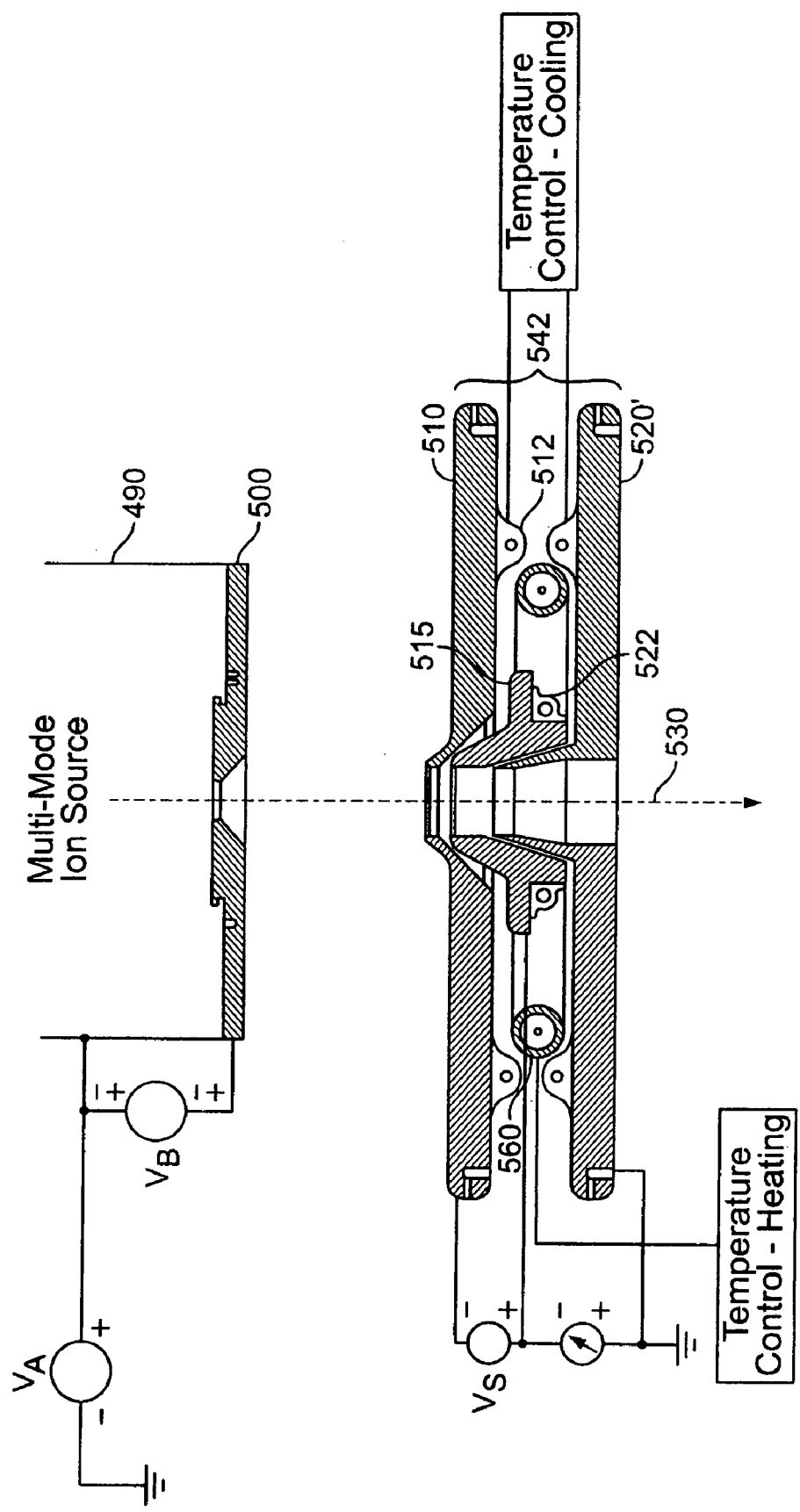
FIG. 9C: Extraction electrode assembly having heating and cooling features and three electrode elements.

Referring to FIG. 9C, the extraction assembly may instead comprise three electrode elements: suppression electrode 510, as in FIG. 9B, a central electrode 515, and the main extraction electrode 520'. Electrode 520' is maintained at ground (housing) potential, the potential of central electrode 515 is variable and can be maintained at a selected potential between ground and a considerable value, for instance −30 KeV. The potential of suppression electrode 510 may float at voltage Vs, for instance, −10 KeV, relative to the central electrode. In this arrangement the ion-accelerating and focal-length adjusting effects of the electrode system may be varied for obtaining desired effects upon the ion beam.

The electrode elements are nested, as shown in FIG. 9C, so that the beam passing through the electrode elements is exposed only to the respective potentials of the three elements. In the arrangement shown, the two outer electrode elements are supported by circular radiant heat-receiving, heat-conductive disc portions, while the central electrode is of less transverse extent, supported between the outer electrodes by suitable support structure, not shown. A tubular heater 560 of suitable dimension is disposed between the two outer electrode structures 510, 520', and surrounds inner electrode structure 515. The heater is constructed and arranged to heat the three electrode structures by direct radiation to each. Radiation proceeds generally axially toward the outer disc portions of the outer two electrode elements, and radially inwardly toward the center electrode. By suitable temperature sensing, as by the thermocouple previously mentioned, a representative temperature of the electrode assembly is detected. Electrical heating current through the tubular heater maintains the temperature at a set point to prevent condensation on the electrodes of feed vapors that reach the assembly. For instance, when ionizing decaborane and octadecaborane by "soft" electron impact, the temperature of the electrode elements may be maintained at about 150 C. Similar to the embodiment of FIG. 9B, each of the electrode structures is also provided with a cooling coil 512 and 522, and the assembly of FIG. 9C may instead be cooled as described when an ion source operates in hot mode.

While the heated arrangement of a three-electrode system has been shown in FIG. 9C with respect to a multimode ion source, it is of course useful with replaceable hot and cool mode ion sources. For use with only cool-operating ion sources, such as shown in FIGS. 7 and 7A, the cooling feature may be omitted from the electrode assembly, or the cooling feature may be retained, available for use with an arc-discharge hot plasma source that may, from time to time, be substituted for the soft electron impact source.

Source Lifetime Measurements when Running Decaborane

FIG. 14 shows the results of source lifetime testing over a broad range of decaborane flows. The fit to these data is from Equation (3). No failures of the ion source were recorded during these tests; rather, the individual tests were ended when the decaborane ion current dropped to roughly half of its initial level. Upon inspecting the ion source, it was found that a substantial amount of boron-containing material was deposited within the ionization chamber, mostly adhering to the interior walls of the chamber. In some cases, the ion extraction aperture was also partially occluded. The model of Equation (3) seems to fit the data well, and suggests that "lean" operation is the key to prolonged ion source lifetime, between in situ chemical cleaning procedures or disassembly.

Measurements of Etch Rates within Ionization Chamber During F Cleaning

Figure 15:
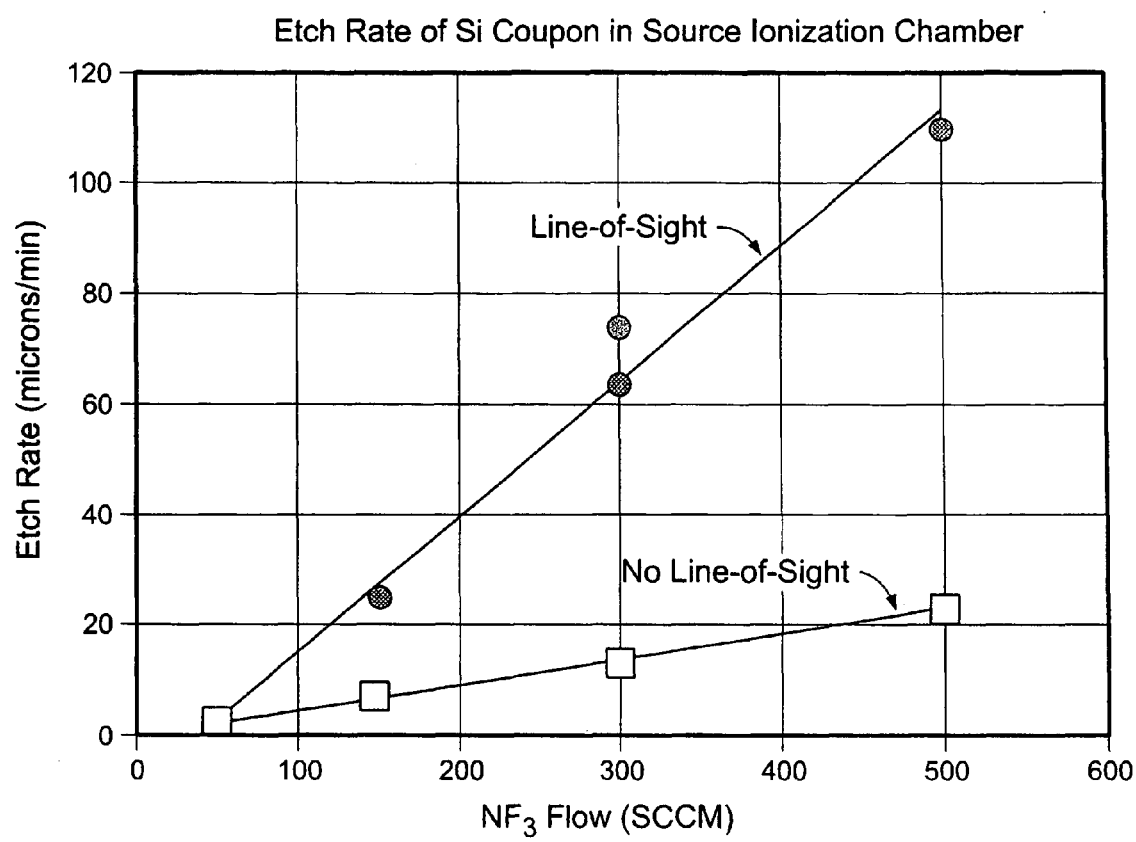
FIG. 15: Etch rate of Si coupon.

The system with the ion source 10 of FIG. 7 was used to test the F cleaning process on 1-mm-thick silicon coupons staged inside of the ionization chamber 44, with the following modification: rather than incorporating a dedicated reactive feed conduit, the vapor feed conduit 32 was employed to introduce the reactive gas. Si was used because etching of Si by F is well understood, and pure Si material is available in the form of Si wafers. This test required removing the vaporizer between cleaning cycles. Two coupon locations were tested: one having line-of-sight relationship with the reactive gas inlet (i.e., the vapor feed 32), and one not having line-of-sight. The etch rates are shown in FIG. 15 as a function of $NF_3$ flow rate. During this process, a flow of 700 sccm of argon was maintained into the remote plasma source while the $NF_3$ flow rate was varied from 50 sccm to 500 sccm. A line-of-sight geometry shows a factor of about five increase in etch rate, and is therefore a preferred geometry if it can be done uniformly. To this end, the geometry portrayed in FIG. 3 should provide better etch uniformity of the ion source ionization chamber 44 than the geometry shown in FIG. 4. The test also indicated that location of etch-sensitive components shielded from the gas flow is effective to provide a degree of protection to those components.

To extend the life of components of the self-cleaning ion generating system construction materials are selected that are resistive to the reactive gas, and provision can be made for shielding of sensitive components.

For the interior of the ionization chamber, as indicated above, aluminum is employed where the temperature of the ionizing action permits because aluminum components can withstand the reactive gas fluorine. Where higher temperature ionizing operation is desired, an aluminum-silicon carbide (AlSiC) alloy is a good choice for the surfaces of the ionization chamber or for the extraction electrode. Other materials for surfaces in the ionization chamber are titanium boride ($TiB_2$), Boron Carbide ($B_4C$) and silicon carbide (SiC).

For components exposed to the fluorine but not exposed to the ionizing action, for instance electron source components such as electrodes, the components may be fabricated of Hastelloy, fluorine-resistant stainless steels and nickel plated metals, for instance nickel-plated molybdenum.

Both inert gas shields and movable physical barriers can protect components of the system from the reactive gas during cleaning. For example, referring to FIG. 7A, a conduit 113 for inert gas, for instance argon, extends from a gas source, not shown. Its outlet is at a strategic location in the ion source, such that flow of the inert gas, when initiated for the cleaning cycle, floods the component to be protected. In FIG. 7A the outlet 113a of inert gas conduit 113 aims a flooding stream of argon over the active components of electron gun 112, including, the electron-emitting cathode. In FIG. 7A a movable shield member 73 is also shown, which is movable into position for the cleaning cycle. In the example shown, it is movable over the aperture 71A leading to beam dump 72, or to another electron gun when provided on that side of the ionization chamber 44.

The cleaning process described above was conducted to observe its effect on boron deposits within the ionization chamber and on the interior of the ion extraction aperture of the novel ion source 10 of FIG. 7. The observed etch rates had characteristics similar to the plot of FIG. 15, but were a factor of 3 lower. Thus, for a $NF_3$ flow rate of 500 sccm, the etch rate for decaborane deposits were 7 μm/min (no line-of-sight), and 36 μm/min (line-of-sight). The interior of the ion extraction aperture after running 4 hrs of decaborane at 0.8 sccm vapor flow had about 133 μm thick boron-containing deposit prior to cleaning. Observations were made after a 5 min F clean, and after a 15 min F clean using these flow rates. One side of the aperture plate was in line-of-sight with the vapor feed. It was observed from the cleaning pattern that the vapor feed aperture is centered in the vertical direction! After 15 minutes of cleaning, the plate was almost completely free of deposits. Also, the novel heated aluminum ion extraction electrode of FIG. 10 was removed and inspected after long operation. It was very clean with no observable decaborane deposits. This was undoubtedly due to exposure of the electrode to reactive F (F can flow through the ion source ion extraction aperture located in front of the vapor conduit, to the extraction electrode directly in front of it). Also, elevated temperature of the Al electrode assembly increased the effective etch rate of its deposits.

With respect to the ionization chamber, again, a 15 min etch clean left the chamber nearly free of deposits. A test was conducted in which the system was repeatedly cycled in the following manner: two hours of decaborane operation (>500 μA of analyzed beam current), the source was turned off and the filament allowed to cool, followed by a 15 min chemical clean at 500 sccm of $NF_3$ feed gas and 700 sccm of Ar, to see if conducting repeated chemical cleaning steps was injurious to the ion source or extraction electrode in any way. After 21 cycles there was no measurable change in the operating characteristics of the ion source or the electrode. This result demonstrates that this F cleaning process enables very long lifetime in ion source operation of condensable species.

The Ion Generating System Incorporated into an Exemplary Ion Implanter

FIG. 16 shows the basic elements of a commercial ion implanter, with an embodiment of the novel ion beam generation system incorporating the ion source of FIG. 7 installed. The ion source 10 is inserted into the source vacuum housing 209 of the ion implanter. It is electrically insulated from housing 209 by insulator 211. The ion extraction electrode 220 extracts and accelerates ions from the ion source 10 to form an ion beam 200. Ion beam 200 propagates entirely in vacuum; from the electrode 220 it enters analyzer housing 290, 300 where it is bent and dispersed by dipole analyzer magnet 230 into separate beamlets which differ by their charge-to-mass ratio. The ion beamlet of interest passes through mass resolving aperture 270 and into a final acceleration (or deceleration) stage 310. The thus-produced, -selected and -accelerated ion beam 240 leaves the ion beam forming system 208 and is introduced to the process chamber 330 where it intercepts one or more device wafers 312 on rotating disk 314. The ion source vacuum housing 209 can be isolated from the remainder of the implanter's vacuum system by closing isolation valve 210. For example, isolation valve 210 is closed prior to in situ cleaning of the ion source and the ion extraction electrode 220. The extraction electrode 220, may be temperature controlled in any of the ways described above.

Obviously, many modifications and variations of the present invention are possible in light of the above teachings. Thus, it is to be understood that, within the scope of the appended claims, the invention may be practiced otherwise than as specifically described above.

We claim:

1. An ion extraction electrode assembly constructed for use in an ion implantation system, the ion implantation system having an ion source that has a low temperature operating mode for ionizing gasses and vapors at relatively low temperatures below 400° C., the ion extraction electrode assembly comprising:
a temperature controlled extraction electrode comprising a suppression electrode element and a ground electrode element, said extraction electrode configured to extract ions from the ion source as an ion beam for transport to a surface for ion implantation, and
a temperature controllable heater disposed between said suppression electrode element and said ground electrode element, said heater configured to maintain the extraction electrode at a temperature sufficient to prevent condensation on the electrode of gases or vapors, said extraction electrode and said controllable heater configured to form an assembly, wherein the ion extraction electrode is capable of being heated to about 150 C. for alternative operation with decaborane and octadecaborane.

2. The ion extraction electrode assembly of claim 1, wherein said suppression electrode element and said ground electrode element are fixedly disposed with respect to each other and comprised of aluminum.

3. The ion extraction electrode assembly of claim 1 comprised of molybdenum.

4. The ion extraction electrode assembly of claim 1 constructed and arranged to be heated to a temperature between about 150 C. and 250 C.

5. The ion extraction electrode assembly of claim 1 constructed for use with said low temperature operating ion source which includes a vaporizer for decaborane or octadecaborane.

6. The ion extraction electrode assembly of claim 5 capable of being heated to about 150 C. for alternative operation with decaborane and octadecaborane.

7. An ion implantation system comprising the ion extraction electrode assembly of claim 1 installed in a vacuum housing in position adjacent an ion source to extract ions from the ion source through an extraction aperture to form an ion beam for implantation.

8. The ion implantation system of claim 7 in which the ion extraction electrode assembly is arranged to be periodically cleaned by exposure, while in the vacuum housing, to reactive halogen-containing gas.

9. The ion implantation system of claim 8 in which the electrode is arranged to be exposed to reactive halogen-containing gas emanating from an ionization chamber of the ion source through an ion extraction aperture.

10. The ion implantation system of claim 7 in which the low temperature operating ion source includes a vaporizer for decaborane or octadecaborane.

11. The ion extraction electrode assembly of claim 1 in which the heater is constructed to heat the ion extraction electrode by radiation.

12. The ion extraction electrode assembly of claim 1 having an elongated, slot-form aperture adapted to pass a ribbon-like ion beam for transport to a surface for ion implantation.

13. The ion extraction electrode assembly of claim 12 in which the heater includes heater portions disposed on each of the long sides of the slot-form aperture.

14. The ion extraction electrode assembly of claim 13 in which the heater comprises a continuous electric resistance element having portions disposed to each of the long sides of the slot-form aperture.

15. The ion extraction electrode assembly of claim 14 in which the heater comprises a tubular heater comprising a tube through which the electric resistance element extends, portions of the tubular heater being disposed to each of the long sides of the slot-form aperture.

16. The ion extraction electrode assembly of claim 12 in which the heater comprises multiple discrete cartridge heater units, at least one of the heater units disposed to each of the long sides of the slot-form aperture.

17. The ion extraction electrode assembly of claim 1 in which at least one electrode element of the extraction electrode comprises an inner portion defining a beam aperture and an outer portion in heat-conductive relation to the inner portion, the outer portion defining a heat-receptive surface for absorbing heat radiated from the heater.

18. The ion extraction electrode assembly of claim 17 in which the heat-receptive surface faces generally in the direction of extent of a beam path through the electrode and the heater is spaced in the direction of extent of the beam path from the heat-receptive surface.

19. The extraction electrode assembly of claim 18 in which the heat-receptive surface is of disc form.

20. The ion extraction electrode assembly of claim 1 in which at least one electrode element of the extraction electrode comprises a portion that both defines a beam aperture and a heat-receptive surface for absorbing heat radiated from the heater.

21. An ion implantation system comprising an ion extraction electrode assembly comprising a suppression electrode element and a ground electrode element fixedly disposed relative to each other and installed in a vacuum housing in position adjacent an ion source to extract ions from the ion source through an extraction aperture to form an ion beam for implantation, the ion source having a high temperature operating mode, the ion extraction electrode assembly being comprised of aluminum and combined with a cooling device for operation during high temperature operation of the ion source to cool the electrode to a temperature below about 400 C., wherein the ion extraction electrode assembly is capable of being heated to about 150 C. for alternative operation with decaborane and octadecaborane.

22. The ion implantation system of claim 21 in which the electrode is arranged to be periodically cleaned by exposure, while in the vacuum housing, to reactive halogen-containing gas.

23. The ion implantation system of claim 22 in which the electrode is arranged to be exposed to reactive halogen-containing gas emanating from an ionization chamber of the ion source through an ion extraction aperture.

* * * * *